(12) United States Patent
Nakane

(10) Patent No.: US 7,738,118 B2
(45) Date of Patent: Jun. 15, 2010

(54) TAPE FEEDER AND ELECTRONIC-CIRCUIT-COMPONENT SUPPLYING APPARATUS

(75) Inventor: Nobuyuki Nakane, Toyota (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 880 days.

(21) Appl. No.: 11/578,120

(22) PCT Filed: Apr. 13, 2005

(86) PCT No.: PCT/JP2005/007167

§ 371 (c)(1),
(2), (4) Date: Oct. 10, 2006

(87) PCT Pub. No.: WO2005/101944

PCT Pub. Date: Oct. 27, 2005

(65) Prior Publication Data

US 2008/0283191 A1    Nov. 20, 2008

(30) Foreign Application Priority Data

Apr. 15, 2004  (JP)  ............................. 2004-120597

(51) Int. Cl.
*G01B 11/14* (2006.01)

(52) U.S. Cl. ...................... 356/614; 356/620

(58) Field of Classification Search ......... 356/614–617, 356/620–623

See application file for complete search history.

(56) References Cited

U.S. PATENT DOCUMENTS 4,789,907 A * 12/1988 Fischetti et al. ............. 386/107

FOREIGN PATENT DOCUMENTS

| JP | A 64-052296  | 2/1989  |
|----|--------------|---------|
| JP | A 04-372199  | 12/1992 |
| JP | A 06-291490  | 10/1994 |
| JP | A 08-023190  | 1/1996  |
| JP | A 10-112598  | 4/1998  |
| JP | B 2824378    | 11/1998 |
| JP | A 2000-82900 | 3/2000  |
| JP | B 3093339    | 10/2000 |
| JP | A 2002-57495 | 2/2002  |
| JP | A 2003-347794| 12/2003 |

* cited by examiner

*Primary Examiner*—Gregory J Toatley, Jr.
*Assistant Examiner*—Tri T Ton
(74) *Attorney, Agent, or Firm*—Oliff & Berridge, PLC

(57) ABSTRACT

A tape feeder includes a feeding member which feeds a carrier tape having feed holes in its lengthwise direction, and accommodating pockets which are arranged in the lengthwise direction, accommodate respective circuit components and have a predetermined position relative to the holes. The feeding member feeds the tape so that the circuit components are sequentially positioned at a component-supply position. The tape feeder also includes a tape-support surface which supports a surface of the tape and which has, in a path-related portion thereof located along a path of movement of the holes, one or more optical-characteristic giving portions each of which is larger than one of the holes and has a first optical characteristic that is given to the one hole and is recognized differently by an optical recognizing device than a second optical characteristic of another portion of the path-related portion.

18 Claims, 12 Drawing Sheets

TAPE FEEDER AND ELECTRONIC-CIRCUIT-COMPONENT SUPPLYING APPARATUS

TECHNICAL FIELD

The present invention relates to a tape feeder and particularly to the art of improving the accuracy with which electronic circuit components held by a carrier tape are supplied from the carrier tape.

BACKGROUND ART

Electronic circuit components are mounted on a circuit substrate so as to provide an electronic circuit. For example, electronic circuit components are held by a carrier tape, and the carrier tape is fed by a tape feeder so as to supply the electronic circuit components. The carrier tape has a multiplicity of feed holes arranged in a lengthwise direction thereof, and a multiplicity of component accommodating pockets that are arranged in the lengthwise direction and accommodate respective electronic circuit components and that have a predetermined relative position relative to the feed holes. When the carrier tape is fed by a feeding device of the tape feeder, the respective electronic circuit components accommodated by the component accommodating pockets are sequentially positioned at a component-supply position.

It is desirable that each of the electronic circuit components be accurately positioned at the component-supply position. However, because of, e.g., manufacturing errors and/or assembling errors of the tape feeder, positional errors may occur to the tape feeder so that when an electronic circuit component is taken from a component accommodating pocket, a failure to take the component may occur. Conventionally, various countermeasures have been proposed to solve this problem. For example, the below-identified Patent Document 1 discloses an electronic-circuit-component supplying and taking apparatus that takes, with an image taking device, an image of a feed hole of a carrier tape, subsequently obtains, based on image data representing the taken image, an error of a relative position of the feed hole relative to the image taking device, and corrects, based on the obtained relative-positional error, a component-take position where a suction nozzle takes an electronic circuit component from the carrier tape. Generally, in a carrier tape, a plurality of feed holes and a plurality of component accommodating pockets are accurately formed such that the component accommodating pockets have a predetermined relative position relative to the feed holes. Thus, a component accommodating pocket to be positioned at a component-supply position has a predetermined relative position relative to a feed hole whose image is to be taken by the image taking device, and accordingly a positional error of the feed hole whose image has been taken by the image taking device can be regarded as a positional error of the component accommodating pocket currently positioned at the component-supply position. In many cases, identical feed holes are commonly formed in different sorts of carrier tapes. Since, in those cases, respective images of the identical feed holes are taken and processed, it needs only a less amount of image data to process, or needs only a shorter time to process image data, as compared with the case where images of the component accommodating pockets or the electronic circuit components are taken and processed to obtain relative-positional errors of the component accommodating pockets.

Patent Document 1: Japanese Patent Application Publication No. 2003-347794

DISCLOSURE OF THE INVENTION

Problem Solved by the Invention

However, it is not easy to take accurately, with an image taking device, an image of a feed hole of a carrier tape. Since feed holes are formed through a thickness of the carrier tape, a color of a feed hole when an image thereof is taken by the image taking device is defined by a color of a tape-support surface of a tape feeder that supports a lower surface of the carrier tape. Therefore, when the image taking device takes an image of a feed hole and an image of a portion of the carrier tape that surrounds the feed hole, image data representing the taken images may not clearly define or distinguish the image (i.e., contour) of the feed hole over or from the image of the surrounding portion, if the respective colors of the carrier tape and the tape-support surface are not in good contrast with each other. In particular, in the case where a tape feeder is one that is adapted to feed selectively an arbitrary one of different sorts of carrier tapes and supply the electronic-circuit components carried thereby, and those different sorts of carrier tapes have different colors, it is more difficult to take accurately an image of a feed hole of each of the different sorts of carrier tapes.

It is therefore an object of the present invention to provide a tape feeder that enables a feed hole of a carrier tape to be accurately recognized.

Solution to the Problem

The above object has been achieved by the present invention, which provides a tape feeder, comprising a feeding member which feeds a carrier tape having a plurality of feed holes arranged in a lengthwise direction of the carrier tape, and a plurality of component accommodating pockets which are arranged in the lengthwise direction of the carrier tape and accommodate respective electronic circuit components and have a predetermined relative position relative to the plurality of feed holes, wherein the feeding member has at least one engaging projection to engage the feed holes of the carrier tape and thereby feed the carrier tape so that the respective electronic circuit components accommodated by the component accommodating pockets are sequentially positioned at a component-supply position; and a tape-support surface which supports a surface of the carrier tape that is opposite to respective openings of the component accommodating pockets, and which has, in a path-related portion thereof located along a path of movement of the feed holes, at least one optical-characteristic giving portion which is larger than one of the feed holes and which has a first optical characteristic that is given to the one feed hole and is more appropriate for an optical recognizing device to recognize the one feed hole, than a second optical characteristic given by an other portion of the path-related portion.

Advantages of the Invention

The carrier tape may be any of various sorts of carrier tapes such as an embossed carrier tape of an embossed-carrier-type taping or a punched carrier tape of a punched-carrier-type taping. The feed holes may be formed in only one of widthwise opposite end portions of the carrier tape that extend parallel to each other in a lengthwise direction thereof, or in both of the two end portions. In the latter case, the tape-support surface may have one optical-characteristic giving portion along only one of the two feed-hole movement paths, or may have respective optical-characteristic giving portions along the two feed-hole movement paths. Thus, the optical-characteristic giving portion(s) can enjoy a high grade of freedom. The feeding member may be a sprocket, or a member, disclosed by Japanese Patent Application published for opposition under No. 1-52296, that is movable along a rectangular path. The optical characteristic may be at least one of hue, value, reflection coefficient, etc. For example, even if two portions may have a same hue and a same value, the two portions may have different reflection coefficients and thereby have different optical characteristics, depending upon materials used to form them and/or methods used to finish them. The optical recognizing device recognizes a feed hole positioned above the optical-characteristic giving portion. The feed holes are formed through a thickness of the carrier tape, and accordingly can be given the first optical characteristic by the optical-characteristic giving portion provided in the tape-support surface. Thus, when the optical recognizing device recognizes a feed hole, the feed hole is given the first optical characteristic that is more appropriate than the second optical characteristic given by another portion of the path-related portion. Therefore, irrespective of which optical characteristic the carrier tape may have, the optical recognizing device can accurately recognize the feed hole and accordingly can accurately obtain an actual position of the feed hole and/or a relative-positional error of the feed hole relative to the recognizing device. Based on the thus obtained actual position and/or relative-positional error, an actual position and/or a relative-positional error of a component accommodating pocket being positioned at the component-supply position can be accurately obtained, so that an electronic circuit component can be accurately taken from the component accommodating pocket. In addition, since the optical-characteristic giving portion is larger than one of the feed holes, the first optical characteristic can be given to the entirety of the one feed hole even if the feed hole being positioned above the optical-characteristic giving portion may have some positional error. Thus, the one feed hole can be recognized with reliability. In the case where the tape feeder is adapted to feed only a single sort of carrier tapes so as to supply electronic circuit components, the tape-support surface of the feeder may have only a single optical-characteristic giving portion, and the first optical characteristic of the single optical-characteristic giving portion may be so selected based on an optical characteristic of that sort of carrier tapes as to be able to obtain accurately an image of a feed hole of each of the carrier tapes. In addition, in the case where the tape feeder is adapted to feed selectively any of different sorts of carrier tapes that have different dimensions, carry different sorts of electronic circuit components, have different sorts of component accommodating pockets (e.g., embossed pockets or punched pockets), are formed of different materials, and/or have different optical characteristics, the tape-support surface of the feeder may have only a single optical-characteristic giving portion, if the respective optical characteristics of the different sorts of carrier tapes are same, or substantially same if they may somewhat differ from each other. In the latter case, too, a feed hole of each of the different sorts of carrier tapes can be accurately recognized. Moreover, in the case where the tape-support surface of the tape feeder has a plurality of optical-characteristic giving portions as will be described later, the tape feeder can enable the optical recognizing device to recognize accurately a feed hole of each of different sorts of carrier tapes, even if those carrier tapes may have different optical characteristics. However, there are some cases where the tape-support surface of the tape feeder has only a single optical-characteristic giving portion and yet the tape feeder can enable the optical recognizing device to recognize accurately a feed hole of each of different sorts of carrier tapes having different optical characteristics. For example, in the case where two sorts of carrier tapes have significantly different optical characteristics, the tape feeder may have such a single optical-characteristic giving portion having a third optical characteristic that is intermediate between the significantly different optical characteristics. In this case, the single optical-characteristic giving portion enables the optical recognizing device to recognize accurately a feed hole of each of the two sorts of carrier tapes.

MODES OF THE INVENTION

Hereinafter, some examples of various modes of the present invention that are recognized as being claimable in the present application (hereinafter, referred to as the claimable modes, where appropriate) will be described and explained. The claimable modes include at least respective modes corresponding to the appended claims, but may additionally include broader or narrower modes of the present invention or even one or more different inventions than the claimed inventions. Each of the following modes (1) through (17) is numbered like the appended claims, and depends from the other mode or modes, where appropriate, so as to help understand the claimable modes and to indicate and clarify possible combinations of elements or technical features thereof. It is, however, to be understood that the present invention is not limited to the elements or technical features of the following modes, or the combinations thereof, that will be described below for illustrative purposes only. It is to be further understood that each of the following modes should be construed in view of not only the explanations directly associated therewith but also the detailed description of the best modes of the invention, and that in additional claimable modes, one or more elements or one or more technical features may be added to, or deleted from, any of the following specific modes.

(1) A tape feeder, comprising a feeding member which feeds a carrier tape having a plurality of feed holes arranged in a lengthwise direction of the carrier tape, and a plurality of component accommodating pockets which are arranged in the lengthwise direction of the carrier tape and accommodate respective electronic circuit components and have a predetermined relative position relative to the plurality of feed holes, wherein the feeding member has at least one engaging projection to engage the feed holes of the carrier tape and thereby feed the carrier tape so that the respective electronic circuit components accommodated by the component accommodating pockets are sequentially positioned at a component-supply position; and a tape-support surface which supports a surface of the carrier tape that is opposite to respective openings of the component accommodating pockets, and which has, in a path-related portion thereof located along a path of movement of the feed holes, at least one optical-characteristic giving portion which is larger than one of the feed holes and which has a first optical characteristic that is given to the one feed hole and is more appropriate for an optical recognizing device to recognize the one feed hole, than a second optical characteristic given by an other portion of the path-related portion.

(2) The tape feeder according to the mode (1), wherein the at least one optical-characteristic giving portion is located in a vicinity of the component-supply position.

It is preferred that the recognition of the feed hole be carried out in the vicinity of the component-supply position. In the case where, based on the recognition of the feed hole, a position of the feed hole and a position of the component accommodating pocket being positioned at the component-supply position are obtained, the position of the component accommodating pocket can be obtained with a less error when the feed hole is recognized in the vicinity of the component-supply position. Thus, it is preferred that the optical-characteristic giving portion be provided within an area or range distant from the component-supply position by not more than 7 times a pitch at which the feed holes are formed in the carrier tape. More preferably, the range is distant from the component-supply position by not more than 5, 3, or 2 times the pitch.

(3) The tape feeder according to the mode (1) or the mode (2), wherein the at least one optical-characteristic giving portion comprises at least one color giving portion which has, as the first optical characteristic, a first color which is given to the one feed hole and thereby enables the optical recognizing device to recognize the one feed hole by distinguishing the first color from a second color of a portion of the carrier tape that surrounds the one feed hole.

In the case where the carrier tape has a pre-selected color, the optical-characteristic giving portion may have a first color that is given to the feed hole and thereby enables the optical recognizing device to recognize the feed hole by distinguishing the first color from the pre-selected, i.e., second color of a portion of the carrier tape that surrounds the feed hole. Thus, the feed hole can be clearly, therefore accurately, recognized by the optical recognizing device. Here, each of the first and second colors may be an achromatic color or a chromatic color.

(4) The tape feeder according to any of the modes (1) to (3), wherein the tape-support surface has, as a plurality of the optical-characteristic giving portions, a plurality of different-characteristic giving portions which have different first optical characteristics and which are arranged, in a direction of feeding of the carrier tape, at a pitch equal to a multiple of a pitch at which the feed holes are formed in the carrier tape.

The optical recognizing device may be one that sequentially recognizes a plurality of feed holes, one by one, that are positioned above the plurality of different-characteristic giving portions, respectively, or one that simultaneously recognizes a plurality of feed holes that are respectively positioned above the plurality of different-characteristic giving portions. The plurality of different-characteristic giving portions are arranged at a pitch equal to a multiple of the pitch at which the feed holes are formed, i.e., a product of the latter pitch and an integral number. Therefore, a plurality of feed holes can be simultaneously positioned above the plurality of different-characteristic giving portions, respectively, and the optical recognizing device can simultaneously recognize the plurality of feed holes. Therefore, in the case where the tape feeder is adapted to feed selectively any of a plurality of sorts of tapings respective carrier tapes of which have different optical characteristics, a total number of the different-characteristic giving portions, and/or different optical characteristics of the same can be so determined or selected based on the different optical characteristics of those carrier tapes, so that, for each of the plurality of sorts of tapings or carrier tapes, one of the plurality of feed holes thereof that are respectively given the different optical characteristics of the giving portions can be accurately recognized by the optical recognizing device because the optical characteristic of the one feed hole significantly differs from the optical characteristic of a portion of the each carrier tape that surrounds the one feed hole. Thus, the present tape feeder can selectively feed any of a plurality of sorts of carrier tapes that have different optical characteristics, and thereby enjoy a higher versatility. In addition, since the present tape feeder can enable the optical recognizing device to recognize accurately the feed hole of each sort of carrier tape, and thereby enable the electronic circuit component to be accurately taken from the feed hole. However, it is not essentially required that the plurality of different-characteristic giving portions be provided at the pitch equal to the multiple of the pitch of formation of the feed holes, or that the plurality of different-characteristic giving portions be arranged at regular pitches or distances. If the pitch of formation of the feed holes and the pitch of provision of different-characteristic giving portions are known in advance, the tape feeder can be controlled to move a plurality of feed holes to above the different-characteristic giving portions, respectively, so as to be recognized by the optical recognizing device.

(5) The tape feeder according to the mode (4), wherein the different-characteristic giving portions have, as the different first optical characteristics, at least one of (a) different hues and (b) different values.

Since each of hue and value of color can be classified into different sorts or different grades, the hue and/or the value are/is suitable for use as the different first optical characteristics of the different-characteristic giving portions.

(6) The tape feeder according to the mode (5), wherein the different-characteristic giving portions comprise a plurality of different-hue giving portions having (a) the different hues which differ from each other by not less than two basic hues in a hue circle consisting of ten basic hues.

JIS (Japanese Industrial Standard) Z8721 defines a method of using symbols to represent colors. According to this method, each color is represented by three symbols respectively corresponding to its three elements, i.e., hue, value and saturation (or chroma). The hue is classified into ten basic hues, R, YR, Y, YG, G, BG, B, BP, P, RP, and each basic hue is further classified into hundred grades from 0 (exclusive) to 10.0 (inclusive). Thus, the hue of each color is represented by the combination of alphabet(s) and 0.1-unit digit(s). The value is defined by 0.1-unit digit(s) from 0 (inclusive) to 10.0 (inclusive); and the saturation is defined by 0.1-unit digit(s) without an upper limit. The "basic hues" recited in this mode are defined by this method. The "not less than two basic hues" recited in this mode may be counted in terms of the ten basic hues, or the digit(s) obtained by classifying each basic hue into ten or hundred grades. For example, the different hues of the different-hue giving portions that differ from each other by not less than two basic hues are 5.5R and 5.5Y, respectively, or 5R and 5Y, respectively. A plurality of hues that differ from each other by not less than two basic hues provide a sufficiently great contrast, and accordingly a plurality of feed holes that are given the different hues, respectively, by the different-hue giving portions are sufficiently clearly distinguishable from each other. Therefore, in the case where the tape feeder is adapted to feed selectively any of a plurality of sorts of carrier tapes, the respective hues of the different-hue giving portions can be so pre-determined based on the respective hues of those sorts of carrier tapes, that for each of the sorts of carrier tapes, one of the feed holes that are given the respective hues of the different-hue giving portions may have a great contrast with respect to the hue of the each sort carrier tape and accordingly may be accurately recognized by the optical recognizing device.

(7) The tape feeder according to the mode (5) or the mode (6), wherein the different-characteristic giving portions comprise a plurality of different-value giving portions having (b) the different values which differ from each other by not less than two grades of ten grades into which all values are classified.

A plurality of values that differ from each other by not less than two grades provide a sufficiently great contrast and accordingly a plurality of feed holes that are given the different values, respectively, by the different-value giving portions are sufficiently clearly distinguishable from each other, like in the case where a plurality of feed holes are given the respective different hues that differ from each other by not less than two basic hues. Therefore, for each of a plurality of sorts of carrier tapes having different values, one feed hole thereof can be accurately recognized by the optical recognizing device. According to this mode, in the case where the different-value giving portions have chromatic colors with hues, those hues may be same, or different from each other. In the case where the mode (7) is combined with the mode (6), one feed hole can be more clearly recognized by the optical recognizing device. On the other hand, in the case where the different-value giving portions have achromatic colors without hues and, for example, if two different-value giving portions have the highest value, Grade 10, and the lowest value, Grade 0, respectively, they have the greatest value difference, so that one feed hole can be most clearly recognized. However, this mode is not limited to the last case. For example, two different-value giving portions may have different values that correspond to a gray color near a white color, and another gray color near a black color, respectively. In a particular case, an achromatic color is said to have a hue.

(8) The tape feeder according to the mode (7), wherein the different-value giving portions comprise a bright-color giving portion which has a value of not lower than Grade 8, and a dark-color giving portion which has a value of not higher than Grade 3.

(9) The tape feeder according to the mode (8), wherein the bright-color giving portion comprises a white-color giving portion having a value of Grade 10, and the dark-color giving portion comprises a black-color giving portion which has a value of Grade 0.

For example, in the case where the tape feeder is adapted to feed selectively an embossed carrier tape having a black color and a punched carrier tape having a white color, and can supply electronic circuit components from the two sorts of carrier tapes, a great contrast is provided between the respective values of one feed hole and a portion of each sort of carrier tape that surrounds the one feed hole, when the electronic circuit components are supplied from the each sort of carrier tape. Thus, one feed hole of each sort of carrier tape can be accurately recognized. White and black colors are both achromatic, but they are colors. Each of the white-color giving portion and the black-color giving portion is a sort of color giving portion having the first color that is given to one feed hole and thereby enables the optical recognizing device to recognize the feed hole by distinguishing the first color from a second color of a portion of the carrier tape that surrounds the feed hole. A plurality of different-value giving portions that have respective chromatic colors with a same hue and but different values distinguishable from each other, are another sort of color giving portions.

(10) The tape feeder according to any of the modes (1) to (9), wherein the tape feeder selectively feeds, for supplying the respective electronic circuit components, an arbitrary one of (a) an embossed-carrier-type taping including an embossed carrier tape having the component accommodating pockets that accommodate the respective electronic circuit components, and (b) a punched-carrier-type taping including a punched carrier tape having the component accommodating pockets that accommodate the respective electronic circuit components.

(11) The tape feeder according to any of the modes (1) to (10), wherein the at least one optical-characteristic giving portion is located on an upstream side of the component-supply position with respect to a direction of feeding of the carrier tape.

An upstream-side portion of the carrier tape that is located on the upstream side of the component-supply position with respect to the direction of feeding of the carrier tape, has one or more electronic circuit components accommodated by one or more component accommodating pockets. Since the upstream-side portion of the carrier tape is bound by the feeding member and/or a carrier-tape guide device, one or more feed holes positioned on the upstream side of the component-supply position has or have only a small positional error relative to the component accommodating pocket being positioned at the component-supply position. Therefore, according to this mode, one feed hole having only a small positional error can be recognized by the optical recognizing device, and accordingly an actual position of the component accommodating pocket being positioned at the component-supply position can be accurately obtained. However, it is possible that the optical-characteristic giving portion be located on a downstream side of the component-supply position with respect to the direction of feeding of the carrier tape.

(12) An electronic-circuit-component supplying apparatus, comprising the tape feeder according to any of the modes (1) to (11); an optical recognizing device which recognizes the one of the feed holes of the carrier tape; a feeder-and-recognizing-device relatively moving device which moves at least one of the tape feeder and the optical recognizing device relative to an other of the tape feeder and the optical recognizing device, so that the optical recognizing device is positioned, above the at least one optical-characteristic giving portion, at a recognizing position where the optical recognizing device recognizes the one feed hole; a movement control portion which controls the feeder-and-recognizing-device relatively moving device; and a pocket-position obtaining portion which obtains, based on the predetermined relative position and a position of the one feed hole recognized by the optical recognizing device, a position of one of the component accommodating pockets.

The present electronic-circuit-component supplying apparatus can obtain, based on the accurate recognition of the feed hole, a position of the feed hole and accordingly a position of the component accommodating pocket being positioned at the component-supply position. Thus, an electronic circuit component can be reliably taken from the component accommodating pocket being positioned at the component-supply position.

(13) The electronic-circuit-component supplying apparatus according to the mode (12), comprising the tape feeder according to any of the modes (4) to (9), wherein the movement control portion comprises a recognition-order-dependent movement control portion which controls the feeder-and-recognizing-device relatively moving device such that the optical recognizing device recognizes, in a predetermined order, at least two feed holes of the plurality of feed holes that have, as respective backgrounds thereof, at least two different-characteristic giving portions, respectively.

As explained above with respect the mode (4), one of a plurality of feed holes that are given the respective optical characteristics of the plurality of different-characteristic giving portions, has a good contrast with respect to the optical characteristic of the carrier tape. However, the other feed hole or holes has or have only a poor contrast with respect to the optical characteristic of the carrier tape. Therefore, when the optical recognizing device recognizes, in the predetermined order, two or more feed holes, the optical recognizing device may clearly recognize one feed hole but may not clearly recognize another feed hole. Thus, till the optical recognizing device can clearly recognize one feed hole, the relative movement, and recognizing operation, of the optical recognizing device are repeated. In the present electronic-circuit-component supplying apparatus, irrespective of which sort of carrier tape the tape feeder may feed, the optical recognizing device attempts to recognize two or more feed holes in the predetermined order, i.e., a fixed order, and thereby can clearly and accurately recognize one feed hole. Therefore, it is not needed to pre-determine, for each sort of carrier tape, a recognizing position where the optical recognizing device can clearly recognize one feed hole of the each sort of carrier tape. This leads to reducing an amount of data needed to recognize one feed hole. The present electronic-circuit-component supplying apparatus may employ the tape feeder according to the mode (10) or (11) that is combined with any of the modes (4) through (9).

(14) The electronic-circuit-component supplying apparatus according to the mode (12) or the mode (13), comprising the tape feeder according to any of the modes (4) to (9), wherein the movement control portion comprises a recognition-object-dependent movement control portion which controls the feeder-and-recognizing-device relatively moving device such that the optical recognizing device recognizes one of the plurality of feed holes that has, as a background thereof, a pre-selected one of the plurality of different-characteristic giving portions.

In this mode, for each of a plurality of sorts of carrier tapes that can be selectively fed by the tape feeder, a recognizing position where the optical recognizing device can clearly recognize one feed hole of the each sort of carrier tape, is pre-determined based on the optical characteristic of the each sort of carrier tape. Therefore, only one relative movement and only one recognizing operation of the optical recognizing device are needed to recognize clearly one feed hole of the each sort of carrier tape. That is, one feed hole can be quickly recognized by the optical recognizing device.

(15) The electronic-circuit-component supplying apparatus according to any of the modes (12) to (14), wherein the optical recognizing device comprises an image taking device which takes an image of the each feed hole.

The image taking device may be a surface-image taking device that takes a two-dimensional image at once, or a line sensor that has an array of image taking elements. When the line sensor iteratively takes a "line" or linear image while one of the line sensor and one feed hole is moved relative to the other in a direction perpendicular to the array of image taking elements, a two-dimensional image of the feed hole can be taken. When the image taking device takes an image of one feed hole and a portion of the carrier tape that surrounds the one feed hole, the taken image shows the respective optical characteristics of the feed hole and that portion of the carrier tape. That is, if the feed hole is given an appropriate optical characteristic by the optical-characteristic giving portion, an image of the feed hole can be obtained in a good contrast with an image of the portion of the carrier tape that surrounds the feed hole, and accordingly image data clearly representing the image (i.e., contour) of the feed hole can be obtained.

(16) An electronic-circuit-component supplying and taking apparatus, comprising the electronic-circuit-component supplying apparatus according to any of the modes (12) to (15); a nozzle holder which holds a suction nozzle that sucks, with a negative pressure, each of the respective electronic circuit components sequentially positioned at the component-supply position; a holder-and-feeder relatively moving device which moves at least one of the nozzle holder and the tape feeder relative to an other of the nozzle holder and the tape feeder, so that the suction nozzle is positioned at a component-take position opposed to each of the component accommodating pockets sequentially positioned at the component-supply position; and a position correcting portion which corrects the component-take position, based on the position of the one component accommodating pocket obtained by the pocket-position obtaining portion.

If an actual position of one component accommodating pocket is obtained, then an error of the actual position from a nominal position can be obtained. If the component-take position is corrected to delete the error of the actual position, then the suction nozzle and the component accommodating pocket can be positioned with a less error relative to each other, so that an electronic circuit component can be appropriately taken from the component accommodating pocket. That is, one feed hole is accurately recognized, and the actual position of the component accommodating pocket can be accurately obtained based on the accurate recognition of the feed hole, and accordingly the electronic circuit component can be appropriately taken from the component accommodating pocket. Even in the case where the tape feeder is adapted to feed selectively an arbitrary one of a plurality of sorts of carrier tapes and supply electronic circuit components from each of those sorts of carrier tapes, the electronic circuit components can be accurately taken from the each sort of carrier tapes.

(17) An electronic-circuit-component supplying and taking apparatus according to the mode (16), comprising a plurality of the tape feeders which are arranged in an X-axis direction, wherein the holder-and-feeder relatively moving device comprises an X-Y robot which moves the nozzle holder in each of the X-axis direction and a Y-axis direction perpendicular to the X-axis direction, and wherein the position correcting portion comprises an X-Y-robot control data correcting portion which corrects the component-take position by correcting control data to control an operation of the X-Y robot.

In the case where the nozzle holder is moved in each of the X-axis and Y-axis directions, the suction nozzle and each component accommodating pocket can be positioned with a less error relative to each other in each of the X-axis and Y-axis directions, if the control data to control the X-Y robot are corrected.

BEST MODE FOR CARRYING OUT THE INVENTION

Figure 1:
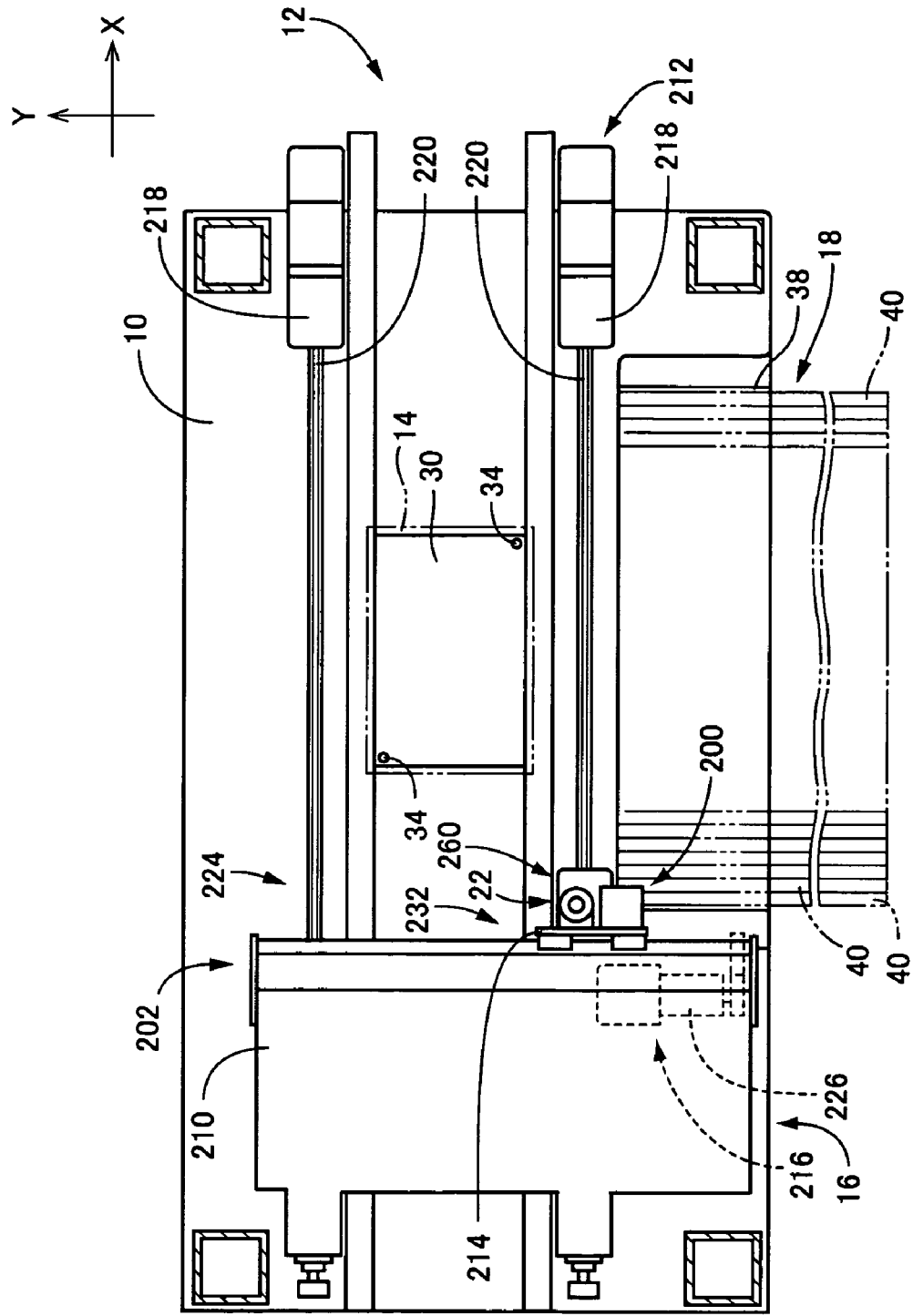
FIG. 1 is a plan view showing an electronic-circuit-component mounting system including an electronic-circuit-component supplying and taking apparatus to which the present invention is applied.

Hereinafter, there will be described in detail an embodiment of the present invention, by reference to the drawings. FIG. 1 shows an electronic-circuit-component mounting system including an electronic-circuit-component supplying and taking apparatus to which the present invention is applied. The present mounting system includes a mounting head 200 that can be moved to an arbitrary position on a plane parallel to a surface of a printed wiring board, receives electronic circuit components 64 from a component supplying device 18, and mounts the components 64 on the wiring board. Since a basic construction of this mounting system is known from, e.g., Japanese Patent No. 2,824,378, it is described below, just briefly.

Figure 2:
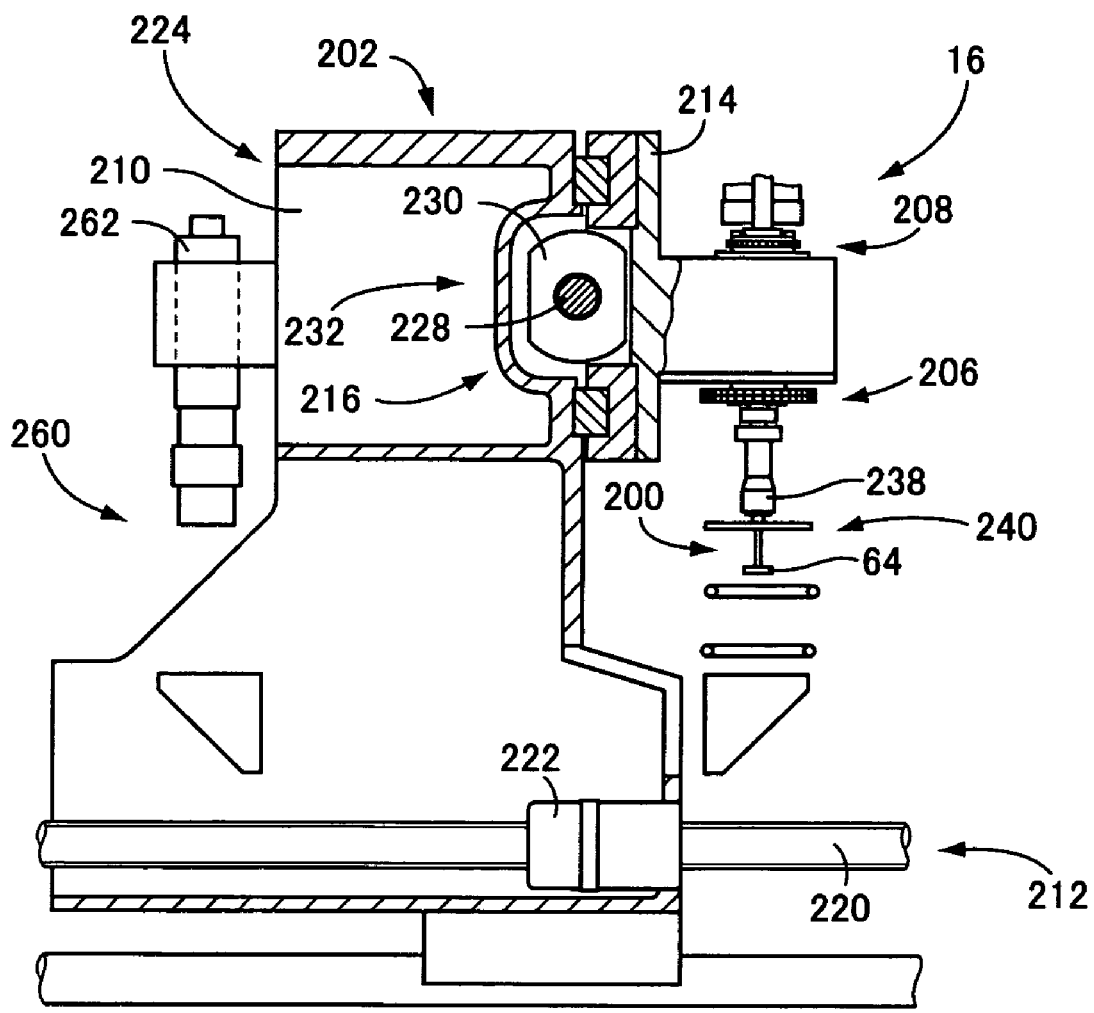
FIG. 2 is a partly cross-sectioned, front view showing a component mounting device of the electronic-circuit-component mounting system.

As shown in FIGS. 1 and 2, the electronic-circuit-component mounting system includes a bed 10 as a base member; a wiring-board conveying device 12 as a substrate conveying device that is provided on the bed 10; a wiring-board holding device 14 as a substrate holding device; a component mounting device 16 as a component taking device; the component supplying device 18; a wiring-board-image taking unit 22 as a substrate-image taking unit; and a control device 24 (FIG. 13) that controls the devices 12, 14, 16, 18, 22. In the present embodiment, an X-Y coordinate plane as a reference coordinate plane is defined for the electronic-circuit-component mounting system, and control data to control movement of, e.g., the mounting head 200 are produced on the X-Y coordinate plane. In FIG. 1, reference numeral 30 designates a printed wiring board as a sort of printed substrate that has, on a component-mount surface thereof, a plurality of (e.g., two) reference marks 34.

As shown in FIGS. 1 and 2, the component supplying device 18 is provided as a stationary element at a fixed position on one side of the wiring-board conveying device 12. The component supplying device 18 has substantially the same construction as that of the component supplying device disclosed by Japanese Patent Application Publication No. 10-112598, except for portions of the device 18 that relate to the present invention. The component supplying device 18 includes a feeder-support table 38, and a plurality of tape feeders (hereinafter, simply referred to as the "feeders") 40 that are detachably attached to the feeder-support table 38 such that the feeders 40 are arranged in an X-axis direction.

Figure 5:
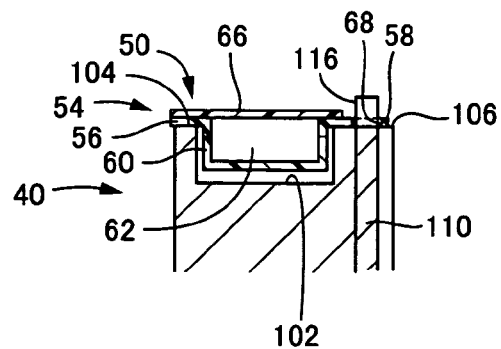
FIG. 5 is a cross-sectional view showing a state in which an embossed-carrier-type taping is supported by two tape-support surfaces of the tape feeder.
Figure 6:
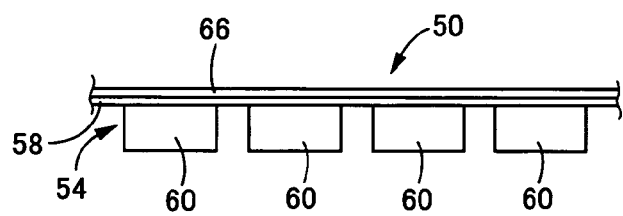
FIG. 6 is a side view showing the embossed-carrier-type taping.
Figure 7:
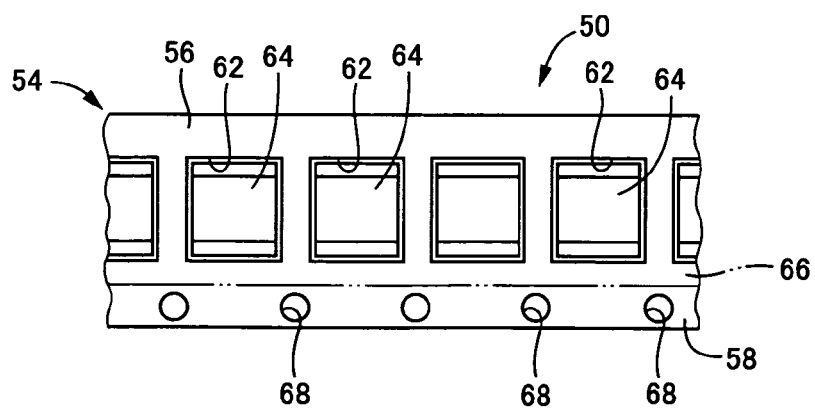
FIG. 7 is a plan view showing the embossed-carrier-type taping.
Figure 8:
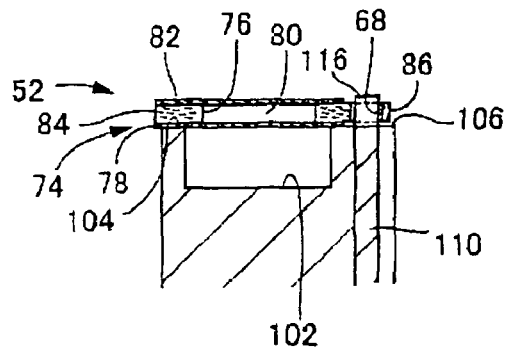
FIG. 8 is a cross-sectional view showing a state in which a punched-carrier-type taping is supported by the two tape-support surfaces of the tape feeder.
Figure 9:
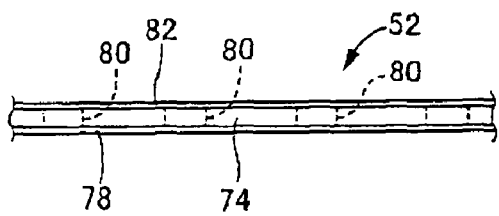
FIG. 9 is a side view showing the punched-carrier-type taping.

In the present embodiment, each of the feeders 40 can be selectively used, for the purpose of supplying electronic circuit components, with an embossed-carrier-type taping 50 (FIGS. 5 through 7) and a punched-carrier-type taping 52 (FIGS. 8 and 9). As shown in FIG. 7, the embossed-carrier-type taping 50 includes an embossed carrier tape 54 having two belt-like to-be-supported portions 56, 58 as two opposite end portions that are opposite to each other in a widthwise direction of the tape 54 and are elongate in a lengthwise direction thereof. In addition, as shown in FIG. 5, the embossed carrier tape 54 has a multiplicity of component accommodating boxes 60 projecting downward from a central portion of the tape 54 located between the two to-be-supported portions 56, 58, such that the boxes 60 are arranged in an array and are equidistant from each other in the lengthwise direction of the tape 54. As shown in FIG. 7, each of the component accommodating boxes 60 defines, therein, a component accommodating pocket 62 that accommodates an electronic circuit component (hereinafter, simply referred to as the "component") 64. The embossed-carrier-type taping 50 additionally includes a cover tape 66 that is adhered to an upper surface of the embossed carrier tape 54, so as to close respective upper openings of the component accommodating pockets 62. Thus, for example, when the embossed-carrier-type taping 50 is fed, the components 64 are prevented from jumping out of the component accommodating pockets 62. In the present embodiment, the embossed carrier tape 54 is formed of a synthetic resin and has a black color, and one 58 of the two to-be-supported portions 56, 58 has a multiplicity of feed holes 68 that are formed through a thickness of the tape 54 such that the feed holes 68 are arranged in an array and are equidistant from each other in the lengthwise direction of the tape 54.

Thus, in the embossed-carrier-type taping 50, the feed holes 68 are arranged in one array, and the component accommodating pockets 62 are also arranged in one array, such that a predetermined relative-positional relationship or relationships is or are present between the feed holes 68 and the pockets 62, e.g., a constant relative-positional relationship is present between the feed holes 68 and the pockets 62 in the lengthwise direction of the taping 50, and a constant distance is present between the feed holes 68 and the pockets 62 in the widthwise direction thereof. However, among different sorts of tapings, e.g., between the embossed-carrier-type taping 50 and the punched-carrier-type taping 52, the relative-positional relationship between the feed holes 68 and the pockets 62 may change. In addition, even in a single taping, e.g., a single embossed-carrier-type taping 50, the relative-positional relationship between the feed holes 68 and the pockets 62 may change. In the case where a pitch at which the component accommodating pockets 62 are formed is equal to a multiple of a pitch at which the feed holes 68 are formed, the relative-positional relationship between the feed holes 68 and the pockets 62 does not change for all the feed holes 68 and all the pockets 62. On the other hand, for example, in the case where the pitch at which the component accommodating pockets 62 are formed is equal to a product of 1.5 and the pitch at which the feed holes 68 are formed, one pocket 62 has the same position as that of one feed hole 68 in the lengthwise direction of the embossed-carrier-type taping 50, but another pocket 62 adjacent to the one pocket 62 has, in the same direction, a middle position between two feed holes 68 adjacent to each other. However, it does not matter. In the latter case, since the different relative-positional relationships occur repeatedly, the relative-positional relationship of one pocket 62 in issue relative to corresponding one feed hole 68 can be obtained while those relationships are taken into account.

As shown in FIGS. 8 and 9, the punched-carrier-type taping 52 includes a punched carrier tape 74 having a multiplicity of rectangular holes 76 that are formed through a thickness of the tape 74 such that the holes 76 are arranged in an array, and are equidistant from each other, in a lengthwise direction of the tape 74. The punched-carrier-type taping 52 additionally includes a bottom tape 78 that is adhered to a lower surface of the punched carrier tape 74 so as to close respective lower openings of the rectangular holes 76 and thereby define respective component accommodating pockets 80 each of which accommodates a component, not shown. In the following description, same reference numerals "64" are commonly used to designate different sorts of electronic circuit components. The punched-carrier-type taping 52 further includes a cover tape 82 that is adhered to an upper surface of the punched carrier tape 74 so as to close the respective upper openings of the rectangular holes 76, i.e., respective upper openings of the component accommodating pockets 80. The punched carrier tape 74 has two belt-like to-be-supported portions 84, 86 as two opposite end portions thereof that are opposite to each other in a widthwise direction of the tape 74 and are elongate in a lengthwise direction thereof, and one 86 of the two to-be-supported portions 84, 86 has a multiplicity of feed holes 68 that are formed through a thickness of the tape 74 such that the feed holes 68 are arranged in an array, and are equidistant from each other, in the lengthwise direction of the tape 74. The feed holes 68 formed in the punched-carrier-type taping 52 are identical with the feed holes 68 formed in the embossed-carrier-type taping 50, i.e., have the same size and are formed at the same pitch. Thus, in the punched-carrier-type taping 52, the feed holes 68 are arranged in one array, and the component accommodating pockets 80 are also arranged in one array, such that a predetermined relative-positional relationship or relationships is or are present between the feed holes 68 and the pockets 80, like the feed holes 68, and the component accommodating pockets 62, of the embossed-carrier-type taping 50. In the present embodiment, the punched carrier tape 74 is formed of paper and has a white color.

Figure 4:
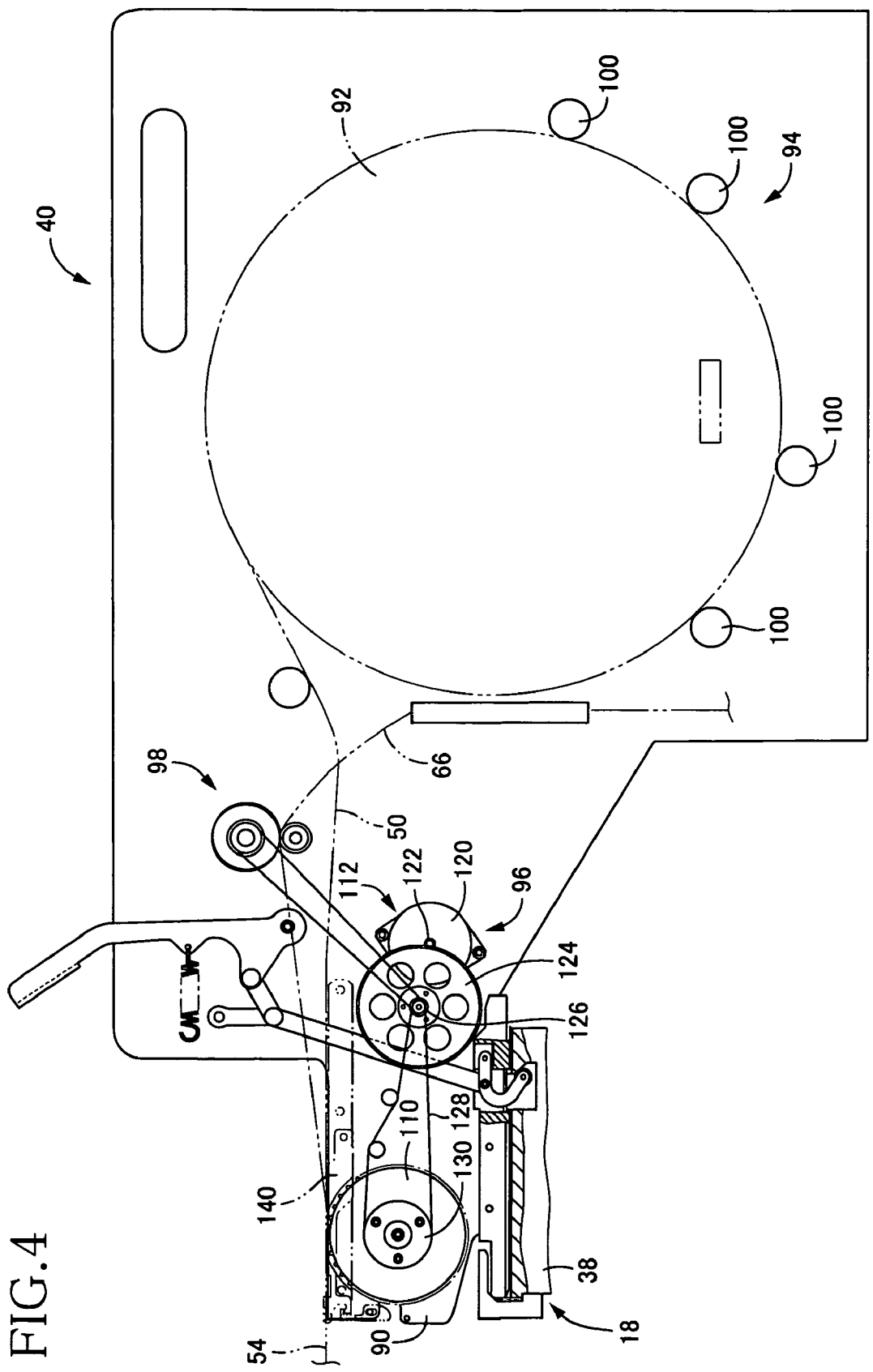
FIG. 4 is a side view showing a tape feeder of a component supplying device of the electronic-circuit-component mounting system.
Figure 10:
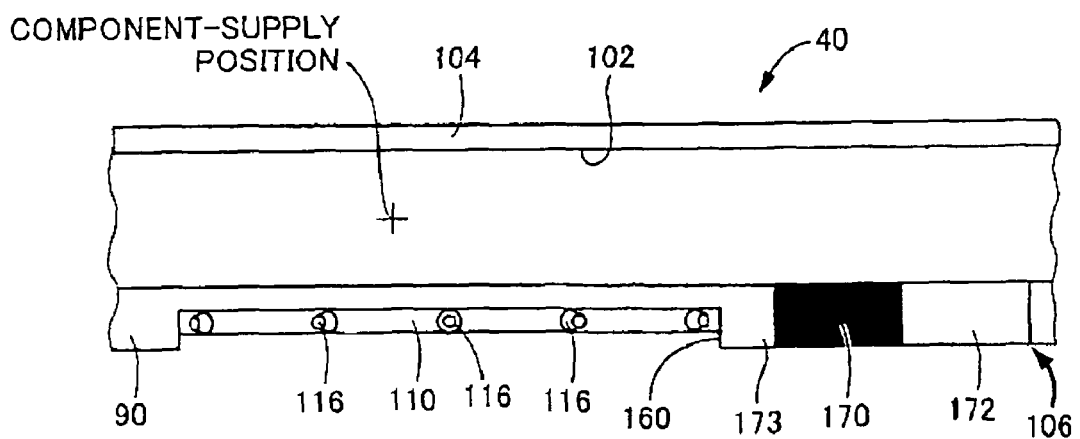
FIG. 10 is a plan view showing a black-colored portion and a white-colored portion that are provided in a main body of the tape feeder.

As shown in FIG. 4, each of the feeders 40 includes a main body 90; a reel holding device 94 as a component-storage holding device or a taping holding device that holds a component-storage reel 92; a tape feeding device 96; and a cover-tape peeling device 98. The reel holding device 94 includes a plurality of support rollers 100 as rotatable support members that cooperate with each other to support the component-storage reel 92 around which the taping 50, 52 is wound, such that the reel 92 is rotatable. As shown in FIGS. 5, 8, and 10, the main body 90 has, in a front portion thereof distant from the reel holding device 94 in a lengthwise direction of the body 90, a groove 102 that opens in an upper surface of the body 90 and extends in the lengthwise direction thereof throughout the front portion thereof. The main body 90 additionally has, on either side of the groove 102 in a widthwise direction of the body 90, two tape-support surfaces 104, 106 that face upward and extend in the lengthwise direction of the body 90.

Figure 11:
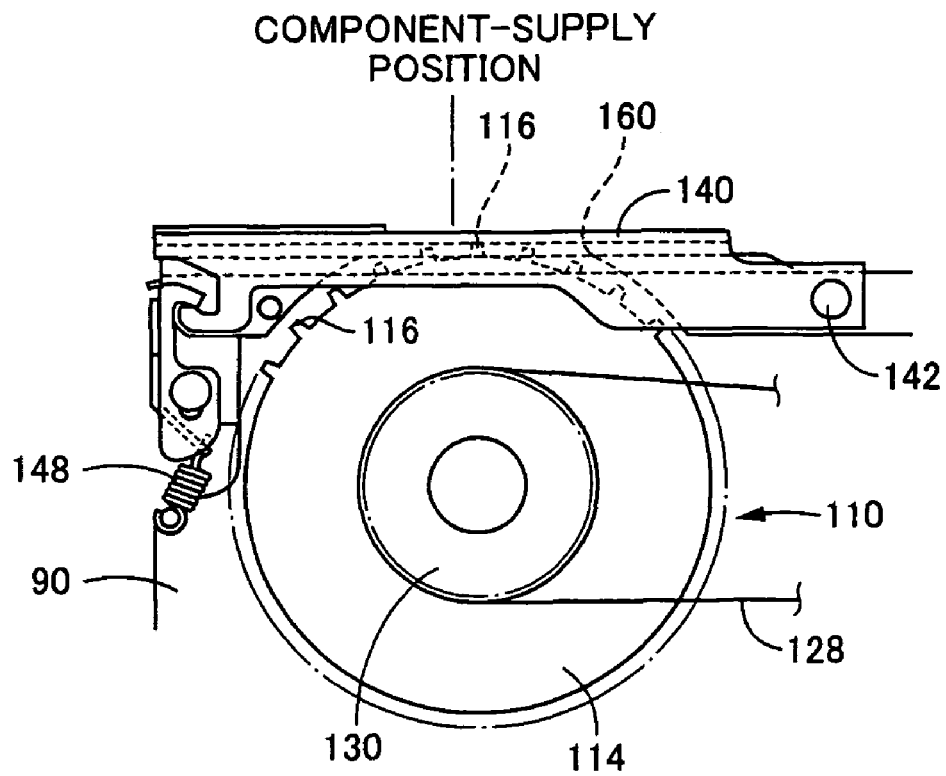
FIG. 11 is a side view showing a sprocket as a feeding member of a tape feeding device of the tape feeder, and peripheral elements around the sprocket.

As shown in FIG. 4, the tape feeding device 96 includes a sprocket 110 as a feeding member; and a sprocket driving device 112 as a feeding-member driving device. As shown in FIG. 11, the sprocket 110 includes a disc-like main body 114; and a plurality of teeth 116 each as an engaging projection that are provided on an outer circumferential surface of the main body 114 such that the teeth 116 are equiangularly spaced from each other in a circumferential direction of the body 114. The main body 114 of the sprocket 110 is supported by the main body 90 of the feeder 40 such that the former body 114 is rotatable about an axis line parallel to the widthwise direction of the latter body 90. At least one of the teeth 116 engages at least one of the feed holes 68 of the carrier tape 54, 74 so as to bind the taping 50, 52.

As shown in FIG. 4, the sprocket driving device 112 includes a stepper motor 120; a drive gear 122; a driven gear 124; a drive pulley 126; a drive belt 128; and a driven pulley 130. The stepper motor 120 is a rotary electric motor as a sort of electric motor that can be accurately controlled with respect to rotation amount or angle, and constitutes a drive source of the sprocket driving device 112. The rotation angle of the stepper motor 120 can be controlled by controlling drive (pulse) signals to be supplied thereto, so that the sprocket 110 is rotated by incremental angles and the carrier tape 54, 74 is fed forward. The stepper motor 120 may be replaced with a servo-motor. Though not described in detail, the cover-tape peeling device 98 shares this drive source with the tape feeding device 96, and peels the cover tape 66, 82 from the carrier tape 54, 74 when the taping 50, 52 is fed.

As shown in FIGS. 4 and 11, each feeder 40 additionally includes a cover member 140 that is provided on the front portion of the main body 90. The cover member 140 covers a portion of the taping 50, 52 that engages the teeth 116 of the sprocket 110, and additionally covers front and rear portions of the same 50, 52 that are located in front and rear of that portion, respectively, and thereby prevents the taping 50, 52 from jumping off the main body 90 of the feeder 40 when the cover tape 66, 82 is peeled from the carrier tape 54, 74. In addition, the cover member 140 prevents the taping 50, 52 from being moved out of position relative to the main body 90 in the widthwise direction thereof. The cover member 140 is attached to the main body 90 via the axis member 142, such that the cover member 140 is pivotable about the axis member 142 that extends parallel to the widthwise direction of the body 90. A spring 148 as an elastic member as a sort of biasing device or member biases the cover member 140 toward the main body 90, so as to maintain the cover member 140 to a state thereof in which the cover member 140 covers the taping 50, 52.

Figure 12:
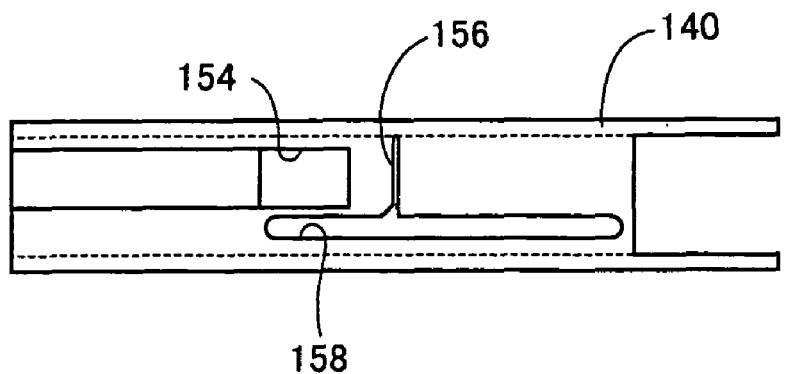
FIG. 12 is a plan view showing a cover member that covers the taping fed by the tape feeder.

As shown in FIG. 12, the cover member 140 has an opening 154 that permits the component mounting device 16 to take each component 64 therethrough. The size (i.e., cross-sectional shape) of component accommodating pockets 62, 80 changes depending upon the size of components 64 accommodated therein. Generally, a suction nozzle 240, described later, takes each component 64 by applying suction to a center of a corresponding component accommodating pocket 62, 80, i.e., a center of the each component 64. In the present embodiment, a component-supply position is provided at a position where the center of each component accommodating pocket 62, 80 is positioned and which is distant by a distance shorter than the pitch at which the feed holes 68 are formed, from a vertically upwardly projecting tooth 116 of the sprocket 110, in a downstream direction with respect to a tape-feed direction in which the taping 50, 52 is fed; and a component-take position is provided at a position which corresponds to the component-supply position and where the suction nozzle 240 takes each component 64.

In addition, the cover member 140 has, on an upstream side of the opening 154 with respect to the tape-feed direction, a slit 156 through which the cover tape 66, 82 peeled off the carrier tape 54, 74 is drawn out. The cover member 140 further has a slot 158 that is formed through a thickness of the member 140. As shown in FIGS. 10 and 11, the main body 90 of the feeder 40 has a recessed portion 160 where the teeth 116 of the sprocket 110 engage the feed holes 68 of the carrier tape 54, 74 and project upward from the tape-support surface 106 into the slot 158 of the cover member 140.

In the case where each feeder 40 feeds the embossed-carrier-type taping 50 so as to supply the components 64, the reel holding device 94 holds the component-storage reel 92 around which the embossed-carrier-type taping 50 is wound. As shown in FIG. 5, the embossed-carrier-type taping 50 drawn from the reel 92 is covered by the cover member 140 in such a state in which the two to-be-supported portions 56, 58 of the taping 50 are supported by the two tape-support surfaces 104, 106, respectively, the component accommodating pockets 60 are received by the groove 102, the feed holes 68 are engaged with the teeth 116 of the sprocket 110, and the taping 50 is positioned by the sprocket 110 in the lengthwise and widthwise directions of the taping 50.

When the sprocket 110 is rotated by the sprocket driving device 112, the embossed-carrier-type taping 50 or the embossed carrier tape 54 is fed by respective distances each equal to the pitch at which the component accommodating pockets 62 are formed, in the lengthwise direction of the taping or tape 50, 54, i.e., the lengthwise direction of each feeder 40 that is parallel to a Y-axis direction perpendicular to the X-axis direction, so that the respective components 64 accommodated by the pockets 62 are sequentially positioned at the component-supply position. The embossed-carrier-type taping 50 is supported by the feeder 40 such that respective lower surfaces of the two to-be-supported portions 56, 58 of the taping 50 that are opposite to the respective upper openings of the pockets 62 are supported by the two tape-support surfaces 104, 106, respectively, and the movement of the taping 50 is guided by the two surfaces 104, 106. The component accommodating pockets 62 are moved while being guided by the groove 102 formed in the main body 90 of the feeder 40. Thus, the two tape-support surfaces 104, 106 also function as tape-guide surfaces; the two to-be-supported portions 56, 58 also function as to-be-guided portions; and portions of the main body 90 that define the tape-support surfaces 104, 106 provide tape-support portions or tape-guide portions.

In the case where each feeder 40 feeds the punched-carrier-type taping 52 so as to supply the components 64, the reel holding device 94 holds the component-storage reel 92 around which the punched-carrier-type taping 52 is wound. As shown in FIG. 8, the punched-carrier-type taping 52 drawn from the reel 92 is covered by the cover member 140 in such a state in which the two to-be-supported portions 84, 86 of the taping 52 are supported by the two tape-support surfaces 104, 106, respectively, and the feed holes 68 are engaged with the teeth 116 of the sprocket 110. When the sprocket 110 is rotated, the punched-carrier-type taping 52 or the punch carrier tape 74 is fed by respective distances each equal to the pitch at which the component accommodating pockets 80 are formed, while respective lower surfaces of the two to-be-supported portions 84, 86 are supported by the two tape-support surfaces 104, 106. Thus, the respective components 64 accommodated by the pockets 80 are sequentially positioned at the component-supply position that is common to both the embossed-carrier-type taping 50 and the punched-carrier-type taping 52.

One 106 of the two tape-support surfaces 104, 106 supports the corresponding to-be-supported portion 58, 86 of the carrier tape 54, 74 that has the feed holes 68. As shown in FIG. 10, the one tape-support surface 106 has, in a path-related portion thereof that corresponds to a path of movement of the feed holes 68, a black-colored portion 170 having a black color whose value is 0 (i.e., Grade 0), and a white-colored portion 172 having a white color whose value is 10 (i.e., Grade 10). The black-colored portion 170 is an example of a dark-color portion having a dark color whose value is not higher than 3 (i.e., Grade 3), and the white-colored portion 172 is an example of a bright color whose value is not lower than 8 (i.e., Grade 8). The black-colored portion 170 and the white-colored portion 172 are different-characteristic giving portions each as a sort of optical-characteristic giving portion. In particular, the black-colored portion 170 and the white-colored portion 172 are different-value giving portions that give different calorimetric values that differ from each other by two or more grades out of the ten grades (i.e., from the lowest grade, Grade 0, to the highest grade, Grade 10). The main body 90 of each feeder 40 is formed of a metal, and the color of each of the two colored portions 170, 172 is different from that of the other portion of the one tape-support surface 106 and is recognized differently by the wiring-board-image taking unit 22 to take an image of one feed hole 68 of a corresponding one of the black, embossed carrier tape 54 and the white, punched carrier tape 74, than that of the other portion 173 of the one tape-support surface 106. When one feed hole 68 is positioned on the black-colored portion 170, the black-colored portion 170 gives the black color to the feed hole 68 formed through the thickness of the carrier tape 54, 74; and when one feed hole 68 is positioned on the white-colored portion 172, the white-colored portion 172 gives the white color to the feed hole 68.

Each of the black-colored portion 170 and the white-colored portion 172 has an area larger than a cross-section area of each feed hole 68, and the two colored portions 170, 172 are provided at respective positions which are located on an upstream side of the component-supply position and the recessed portion 160 with respect to the tape-feed direction and which are aligned, in a state in which one of the component accommodating pockets 62, 80 is positioned at the component-supply position and one of the teeth 116 of the sprocket 110 extends vertically upward, with two adjacent feed holes 68, respectively, that are adjacent to each other in the tape-feed direction and that do not include the feed hole 68 engaged with the vertically upward extending tooth 116. That is, the two colored portions 170, 172 are provided, side by side, in the tape-feed direction, at the same pitch as the pitch at which the feed holes 68 are formed. The two colored portions 170, 172 are provided in the vicinity of the component-supply position. In the present embodiment, the black-colored portion 170 has its center at a position which corresponds to the center of a downstream one of the above-indicated two adjacent feed holes 68 with respect to the tape-feed direction and which is distant from the component-supply position by a distance somewhat shorter than four times the pitch at which the feed holes 68 are formed; and the white-colored portion 172 has its center at a position which corresponds to the center of an upstream one of the above-indicated two adjacent feed holes 68 with respect to the tape-feed direction and which is distant from the component-supply position by a distance somewhat shorter than five times the pitch of formation of the feed holes 68. Here, it is assumed that there is no relative-positional errors between the taping 50, 52 (or the respective centers of the feed holes 68 thereof) and the feeder 40 (or the respective centers of the colored portions 170, 172 thereof).

Each of the two colored portions 170, 172 is formed by treating, by, e.g., plating, a corresponding portion of the metallic, tape-support surface 106. Otherwise, each of the colored portions 170, 172 may be formed by coating the metallic tape-support surface 106 with a paint, or in other manners such as thermo-compression bonding of a film tape. The slot 158 of the cover member 140 has a length that permits the two colored portions 170, 172 to be exposed to the wiring-board-image taking unit 22, in the state in which the taping 50, 52 is covered by the cover member 140.

Though not described in detail, a distance of the two tape-support surfaces 104, 106 of each feeder 40 can be changed or adjusted to be able to support different sorts of tapings having different widths. This adjustment may be carried out in the same manner as the manner disclosed by Japanese Patent Application Publication No. 8-23190.

As shown in FIGS. 1 and 2, the component mounting device 16 essentially includes the mounting head 200; an X-Y robot 202 as a head moving device or a component-holder moving device that moves the mounting head 200 to the arbitrary position on the horizontal plane parallel to the component-mount surface of the printed wiring board 30; a head rotating device 206 that rotates the mounting head 200 about a vertical axis line; and a head elevating and lowering device 208 that elevates and lowers the mounting head 200.

As shown in FIG. 1, the X-Y robot 202 includes an X-axis slide 210 as a first movable member; an X-axis-slide moving device 212; a Y-axis slide 214 as a second movable member; and a Y-axis-slide moving device 216. The X-axis-slide moving device 212 includes two X-axis-slide driving motors 218; two ball screws 220 each as a sort of feed screw; and two nuts 222 (one nut 222 is shown in FIG. 2), and moves the X-axis slide 210 in the X-axis direction. The X-axis-slide moving device 212 cooperates with the X-axis slide 210 to constitute an X-axis moving device 224. The Y-axis-slide moving device 216 includes a Y-axis-slide driving motor 226; a ball screw 228; and a nut 230 (FIG. 2), and moves the Y-axis slide 214 in the Y-axis direction. The Y-axis-slide moving device 216 cooperates with the Y-axis slide 214 to constitute a Y-axis moving device 232.

Figure 3:
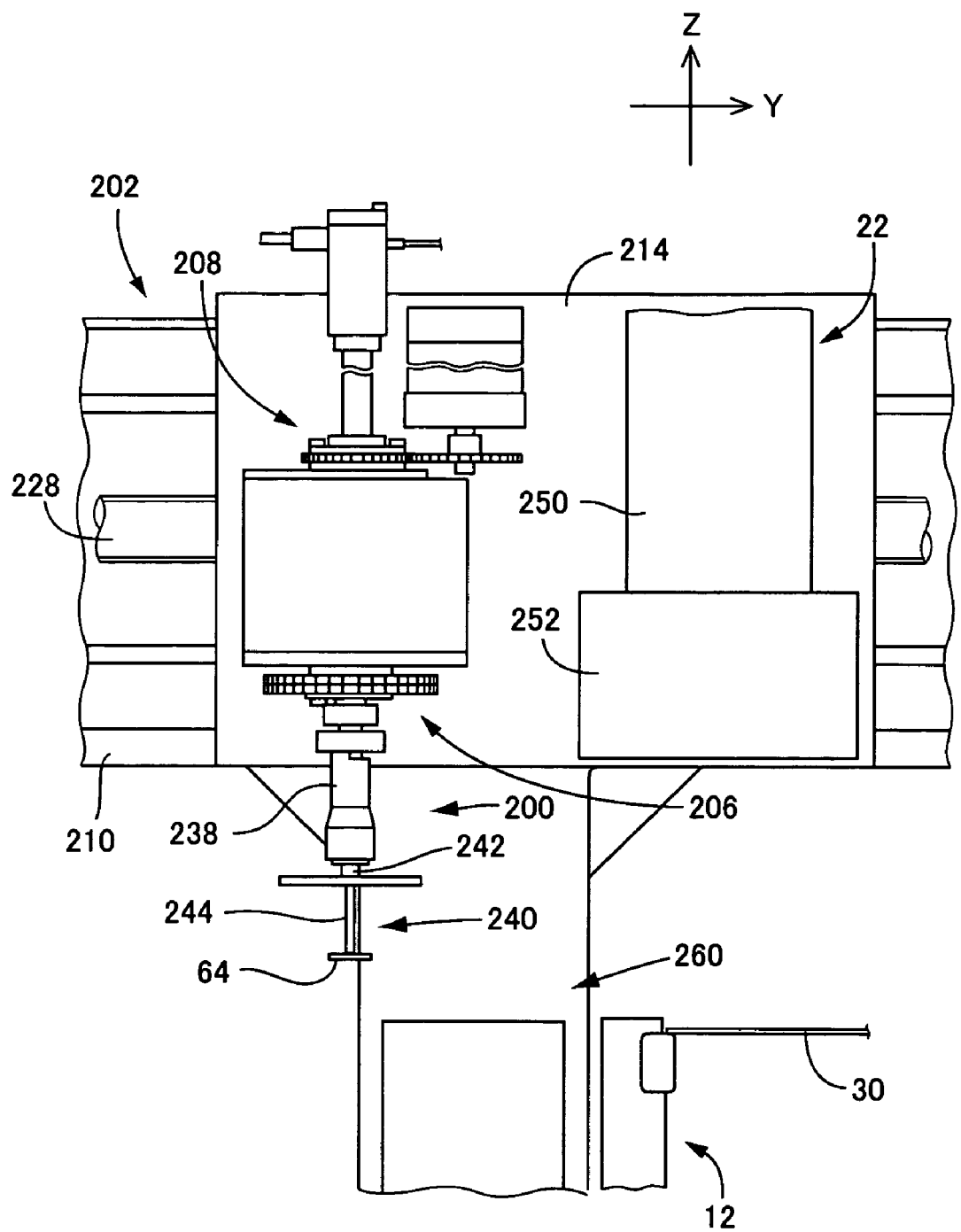
FIG. 3 is a side view showing a mounting head and a wiring-board-image taking unit of the component mounting device.

As shown in FIG. 3, the mounting head 200 includes a nozzle holder 238 that holds the suction nozzle 240 such that the suction nozzle 240 is detachable from the nozzle holder 238. The suction nozzle 240 includes a main body 242 as a base portion, and a suction pipe 244 as a suction portion, and holds, with a negative pressure, a component 64. When the mounting head 200 is moved in the X-axis and Y-axis directions by the X-Y robot 202, the nozzle holder 238 is moved, relative to the feeders 40 and the printed wiring board 30, so that the suction nozzle 240 is moved to the component-take position opposed to the component accommodating pocket 62, 80 being currently positioned at the component-supply position, so as to take a component 64 from the pocket 62, 80, and is moved to a component-mount position where the suction nozzle 240 mounts the component 64 on the wiring board 30. Since the mounting head 200 employed in the present embodiment has substantially the same construction as that of the mounting head disclosed by Japanese Patent No. 3,093,339, more detailed description of the head 200 is omitted.

As shown in FIG. 3, the Y-axis slide 214 carries, in addition to the mounting head 200, the wiring-board-image taking unit 22. The wiring-board-image taking unit 22 includes a wiring-board-image taking device 250 as a substrate-image taking device as a sort of optical recognizing device; and a lighting device 252. The wiring-board-image taking unit 22 is moved with the mounting head 200 by the X-Y robot 202, to the arbitrary position on the horizontal plane. In the present embodiment, the wiring-board-image taking device 250 is a surface-image taking device that momentarily takes a two-dimensional image of an object. The wiring-board-image taking device 250 is constituted by, e.g., a CCD (charge coupled device) camera. In the present embodiment, this camera is a black-and-white camera. As shown in FIG. 2, the X-axis slide 210 carries a component-image taking unit 260. The component-image taking unit 260 includes a component-image taking device 262 that takes an image of the component 64 held by the suction nozzle 240.

Figure 13:
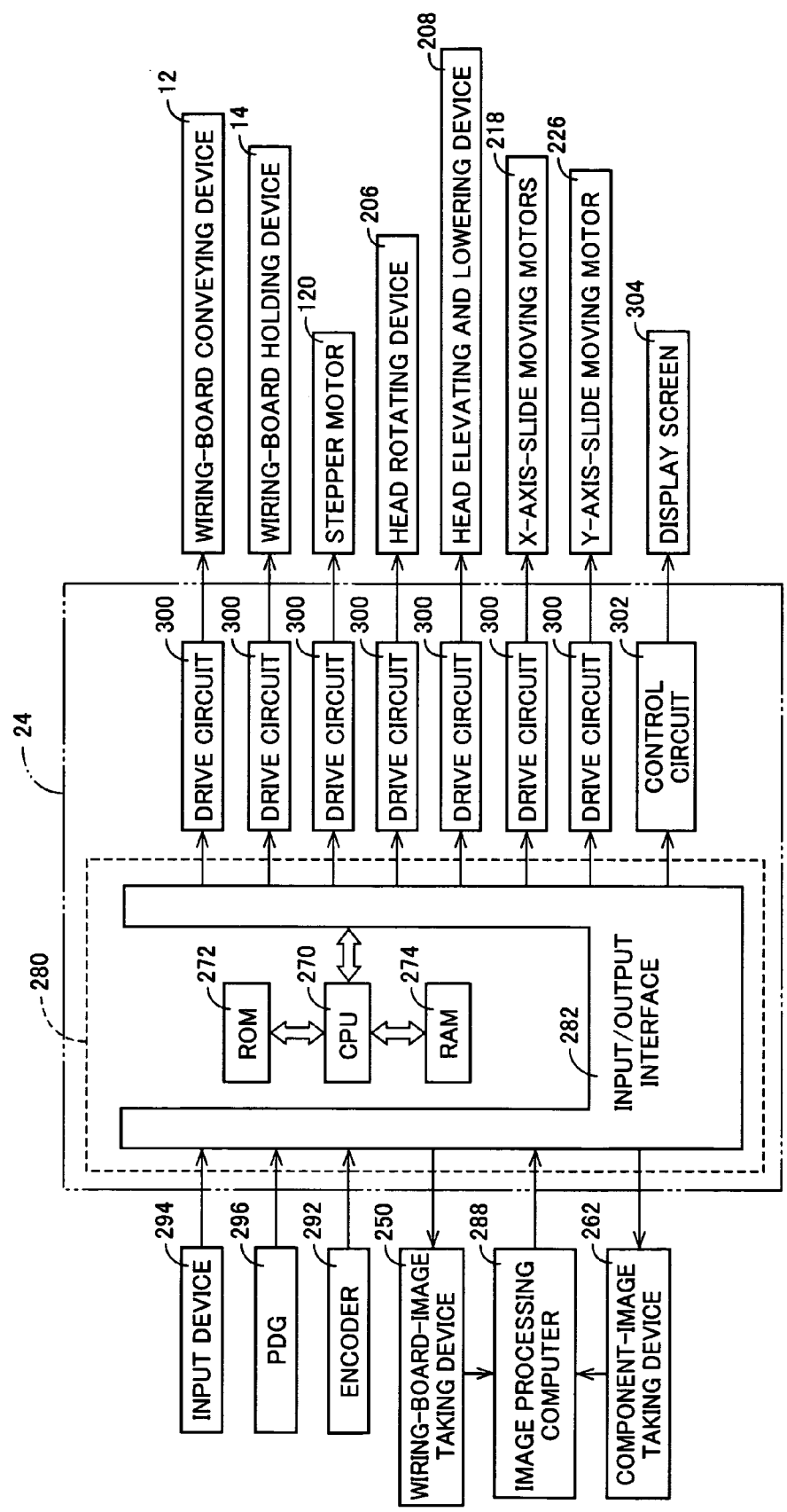
FIG. 13 is a diagrammatic view showing a control device of the electronic-circuit-component mounting system.

As shown in FIG. 13, the control device 24 is essentially constituted by a computer 280 including a CPU 270, a ROM 272, a RAM 274, and a bus for connecting those elements 270, 272, 274 to each other. The bus is connected to an input-and-output interface 282 to which the wiring-board-image taking device 250 of the wiring-board-image taking unit 22, the component-image taking device 262 of the component-image taking unit 260, an image processing computer 288 that processes image data representing the images taken by the wiring-board-image taking device 250 and the component-image taking device 262, an encoder 292 and other sensors, an input device 294, and a part-data generator (PDG) 296 are connected. The PDG 296 is a data base that stores various data related to the parts or components 64 (hereinafter, those data will be referred to as the "component information").

In addition, to the input-and-output interface 282, various actuators such as a drive source of the wiring-board conveying device 12 are connected via respective drive circuits 300, and a display screen 304 is connected via a control circuit 302. An electric motor constituting the drive source of, e.g., the wiring-board conveying device 12 is a sort of actuator. In the present embodiment, many actuators are each constituted by a servo-motor that is a sort of electric rotary motor and that can be accurately controllable with respect to rotation angle. The servo-motors may be replaced with stepper motors. Respective rotation angles of the servo motors are detected by respective encoders each as a rotation-angle detecting device, and each of those motors is controlled based on a corresponding one of the detected rotation angles. FIG. 13 shows a representative one 292 of those encoders.

Figure 15:
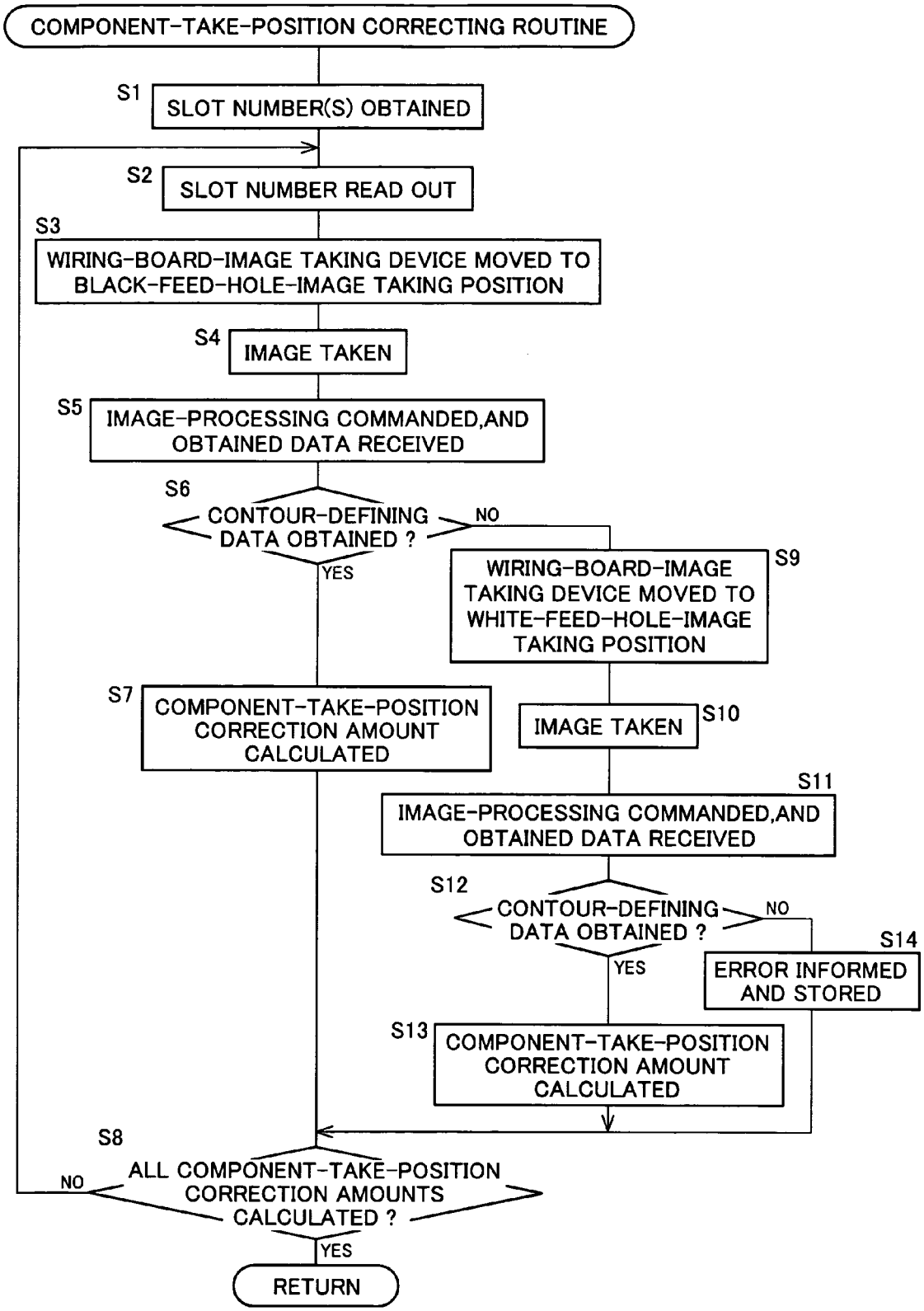
FIG. 15 is a flow chart representing a component-take-position correcting routine that is carried out by the control device.

The ROM 272 and the RAM 274 store various programs and data, for example, a basic operating program for the present electronic-circuit-component mounting system; a program for carrying out a component mounting operation corresponding to the printed wiring board 30 as an object (hereinafter, simply referred to as the component mounting program); and a component-take-position correcting routine represented by a flow chart shown in FIG. 15.

Next, the operation of the present electronic-circuit-component mounting system will be described. Since the operation of mounting the components 64 on the printed wiring board 30 is described in the above-indicated Japanese Patent No. 2,824,378, only portions of the component mounting operation that are pertinent to the present invention will be described in detail, and the other portions will be described just briefly. The above-indicated component mounting program includes data representing the respective component-take positions where the mounting head 200 is to take the components 64 from the feeders 40; data representing the respective component-mount positions where the mounting head 200 is to mount the components 64 on the printed wiring boards 30; data representing the components 64 to be mounted at the respective component-mount positions; and the respective sets of component information that are related to the components 64 and that are supplied from the PDG 296. When the component mounting program is carried out under the control of the basic operating program, the mounting head 200 takes the components 64 from the feeders 40, and mounts those components 64 on the printed wiring boards 30.

The above-indicated data representing the respective component-take positions do not include a relative-positional error between the suction nozzle 240 and the component accommodating pocket 62, 80 positioned at each of the respective component-supply positions of the feeders 40. In fact, however, some relative-positional error may occur for various reasons, so that the suction nozzle 240 may fail to take the component 64 or may take the component 64 with an error. To avoid this problem, the present electronic-circuit-component mounting system carries out, at a time before the components 64 are initially taken from the feeders 40, e.g., at the time when the production of electronic circuits are started, a component-take-position correcting operation in which the wiring-board-image taking device 250 of the wiring-board-image taking unit 22 takes an image of one of the feed holes 68 of the taping 50, 52 held by each of the feeders 40, a positional error of the component accommodating pocket 62, 80 being positioned at the component-supply position of the each feeder 40 is obtained based on the taken image, and the component-take position for the nozzle holder 238 or the suction nozzle 240 held by the holder 238 is so corrected as to delete the obtained positional error. The component-take-position correcting operation will be described in detail later.

After the component-take-position correcting operation, the ordinary, component mounting operation is started. During the component mounting operation, the mounting head 200 is moved, by the X-Y robot 202, to the component-take position where the head 200 takes the components 64 from an arbitrary one of the feeders 40. Since the component-take position has been corrected in the component-take-position correcting operation, the mounting head 200 that has reached the component-take position is lowered by the head elevating and lowering device 208 and, when the negative pressure is supplied to the suction nozzle 240, one component 64 is sucked and held by the nozzle 240.

The mounting head 200 holding the component 64 is moved from the component-take position to a component-mount point opposed to a predetermined component-mount position on the printed wiring board 30, and is lowered, and then elevated, by the head elevating and lowering device 208 so as to mount the component 64 on the board 30. The printed wiring board 30 is conveyed by the wiring-board conveying device 12, and is stopped at a mounting-operation position where the board 30 is supported by the wiring-board supporting device 14 such that the component-mount surface of the board 30 is horizontal. While the mounting head 200 holding the component 64 is moved, an image of the component 64 held is taken, and positional errors of the component 64 held are calculated based on the taken image. The thus calculated positional errors are caused by the translational movements of the mounting head 200, and include respective positional errors of the component 64 in the X-axis and Y-axis directions and a rotation-positional error of the same 64 about a Z-axis direction perpendicular to the X-axis and Y-axis directions.

Not only the thus obtained positional errors of the component 64 but also positional errors of the printed wiring board 30 obtained based on the images of the reference marks 34 taken by the wiring-board-image taking device 250 are corrected. Therefore, the component 64 is mounted, on the printed wiring board 30, at the accurate component-mount position and with the accurate rotation position. Thus, one component 64 is mounted on the board 30.

Next, the component-take-position correcting operation will be described. This operation is carried out, for example, when the electronic-circuit-component mounting system starts the production of electronic circuits, when one or more feeders 40 is or are exchanged with one or more new feeders 40, when the feeders 40 are re-set because of changing of electronic-circuit producing programs, when the component mounting operation is started, each time a predetermined condition is met during the component mounting operation (e.g., each time components 64 have been mounted on a predetermined number of printed wiring boards 30), or each time a predetermined number of components 64 have been supplied from the feeders 40.

Since the component-take-position correcting operation does not change irrespective of when it may be carried out, the following description relates to a representative case where the operation is carried out when the electronic-circuit-component mounting system starts the production of electronic circuits. In this case, the component-take-position correcting operation may be carried out for all the feeders 40. In the present embodiment, however, it is assumed that the operation is carried out for only one or more feeders 40 that is or are to supply components 64 each requiring accurate taking or suction of the suction nozzle 240. The above-described component information as a portion of the component mounting program includes accurate-suction data indicating whether each sort of components 64 requires the accurate suction. Based on the accurate-suction data, one or more feeders 40 that is or are to supply the components 64 requiring the accurate suction are selected from all the feeders 40, so as to be subjected to the component-take-position correcting operation.

The component-take-position correcting operation is carried out by taking an image of one of the feed holes 68 of the taping 50, 52 and correcting, based on a positional error of the feed hole 68 obtained based on the taken image, the component-take position for the nozzle holder 238. Thus, when the basic operating program issues a command to start the component-take-position correcting operation, first, the X-Y robot 202 moves the wiring-board-image taking device 250 to one or more feed-hole-image taking positions each as a sort of feed-hole-image recognizing position where the taking device 250 is to take an image of a feed hole 68 whose position is to be detected at the current time. In the present embodiment, two feed-hole-image taking positions are provided for each one of the feeders 40. One of the two feed-hole-image taking positions is a black-feed-hole-image taking position that is provided above the black-colored portion 170 so as to take a black-color image of a feed hole 68; and the other feed-hole-image taking position is a white-feed-hole-image taking position that is provided above the white-colored portion 172 so as to take a white-color image of another feed hole 68. Each of the two feed-hole-image taking positions is pre-determined or pre-programmed such that at the each feed-hole-image taking position, a center of a two-dimensional image-take surface (e.g., a CCD matrix) of the wiring-board-image taking device 250 coincides with a center of a corresponding one of the two feed holes 68. Thus, in the present embodiment, the center of each of the two feed holes 68 is a recognizing position where the wiring-board-image taking device 250 is to recognize the each feed hole 68, and a center of each of the two colored portions 170, 172 coincides with a corresponding one of the two recognizing positions and has an area larger than that of each feed hole 68. The two feed-hole-image taking positions are pre-programmed, and pre-stored, for each feeder 40 that is pre-programmed to supply components 64 each requiring the accurate suction of the suction nozzle 240. Based on each of the two feed-hole-image taking positions and an attachment position where the each feeder 40 is attached to the feeder-support table 38, a position to which the wiring-board-image taking device 250 is to be moved is obtained on the X-Y coordinate plane. For easier understanding purposes only, it is assumed, in the following description, that in a state in which one of the many component accommodating pockets 62, 80 is positioned at the component-supply position, one of the teeth 116 of the sprocket 110 projects vertically upward, and two feed holes 68 of the many feed holes 68 are positioned above the two colored portions 170, 172, respectively. However, this assumption is not essential to the principle of the present invention, for the reasons described later.

Figure 14A:
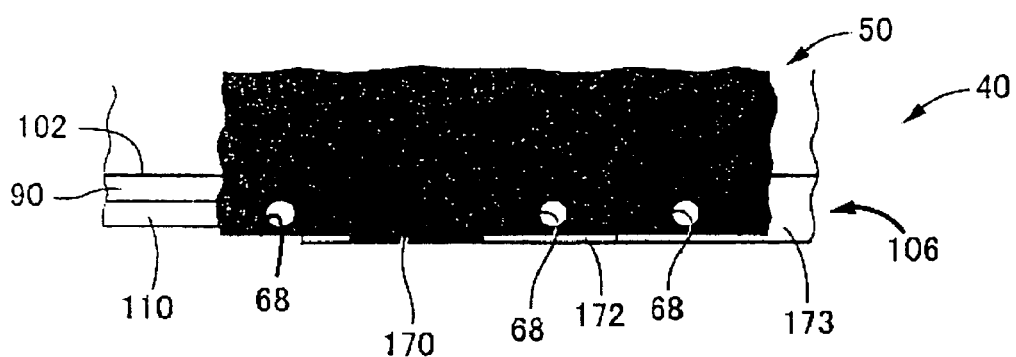
FIG. 14A is a plan view showing a state in which two feed holes of the embossed-carrier-type taping are positioned above the black-colored portion and the white-colored portion, respectively.

An image taking operation is carried out in the state in which one of the component accommodating pockets 62, 80 of the carrier tape 54, 74 is positioned at the component-supply position, and two adjacent feed holes 68 of the same 54, 74 are positioned above the black-colored and white-colored portions 170, 172, respectively. Irrespective of whether the feeder 40 may feed the embossed carrier tape 54 or the punched carrier tape 74, the wiring-board-image taking device 250 is first moved to a pre-selected first one (e.g., the black-feed-hole-image taking position) of the two feed-hole-image taking positions, so as to take an image of a corresponding first one of the two adjacent feed holes 68. The feeder 40 supplies the components 64 held or carried by the embossed-carrier-type taping 50 or the punched-carrier-type taping 52. Therefore, for example, in the case where the feeder 40 feeds the embossed-carrier-type taping 50, first, a black image of the first feed hole 68 is taken and obtained. However, since the embossed carrier tape 54 is also black, contour-defining data representing a contour of the first feed hole 68 cannot be obtained by processing image data representing the taken image. As shown in FIG. 14A, since the first feed hole 68 positioned above the black-colored portion 170 is given the black color, and a portion of the embossed carrier tape 54 that surrounds the black feed hole 68 has also the black color, the contrast between the respective colors of the two elements 68, 54 is poor. In this case, the wiring-board-image taking device 250 is then moved to the other or second feed-hole-image taking position (e.g., the white-feed-hole-image taking position), so as to take an image of the other or second feed hole 68. As shown in FIG. 14A, since the second feed hole 68 positioned above the white-colored portion 172 is given the white color, but the portion of the embossed carrier tape 54 that surrounds the white feed hole 68 has the black color, the contrast between the respective colors of the two elements 68, 54 is sufficiently high. Therefore, accurate contour-defining data representing a sufficiently clear contour of the second feed hole 68 can be obtained by processing image data representing the taken image.

In the present embodiment, each of the feed holes 68 has a circular transverse-cross-section shape. Therefore, based on the thus obtained contour-defining data, an actual position of a center of the second feed hole 68 can be obtained, and a positional error of the thus obtained center of the second feed hole 68, relative to the center of the two-dimensional image-take surface of the wiring-board-image taking device 250, can be obtained. For easier understanding purposes only, it is assumed here that the wiring-board-image taking device 250 has no positional errors and accordingly the positional error of the center of the second feed hole 68 relative to the center of the image-take surface of the device 250 means a positional error (i.e., a translation-movement-caused positional error) of the center of the second feed hole 68 relative to a nominal position of the same 68 that is pre-determined or pre-programmed on the X-Y coordinate plane.

Based on the positional error of the center of the second feed hole 68, an amount of correction of the component-take position where the suction nozzle 240 held by the nozzle holder 238 is to take the component 64 from the component accommodating pocket 62 positioned at the component-supply position, is calculated. Since the second feed hole 68 and the component accommodating pocket 62 are accurately formed, in the carrier tape 54, with a predetermined position relative to each other, it can be said that there is no positional error between the position of the second feed hole 68 positioned above the white-colored portion 172 and the position of the component accommodating pocket 62 positioned at the component-supply position. Therefore, the positional error of the center of the second feed hole 68 is equal to that of the center of the component accommodating pocket 62 positioned at the component-supply position, and the component-take position is so corrected as to cancel the positional error of the center of the pocket 62. Based on the nominal position of the second feed hole 68 and the positional error of the same 68 from the nominal position, an actual position of the hole 68 can be obtained and, based on the actual position of the hole 68 and the predetermined relative position between the nominal position of the hole 68 and a nominal position of the pocket 62 positioned at the component-supply position, an actual position of the pocket 62 can be obtained. Thus, obtaining the positional error of the feed hole 68 means obtaining the actual position of the accommodating pocket 68 or a positional error of the pocket 62 from the nominal position thereof.

Figure 14B:
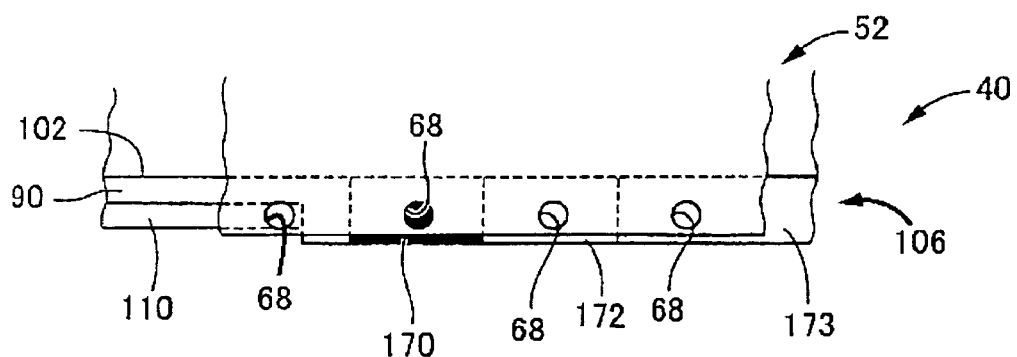
FIG. 14B is a plan view showing a state in which two feed holes of the punched-carrier-type taping are positioned above the black-colored portion and the white-colored portion, respectively.

On the other hand, in the case where the feeder 40 feeds the punched-carrier-type taping 52, a first one of two adjacent feed holes 68 of the punched carrier tape 74 that is positioned above the black-colored portion 170 is given the black color, and a portion of the punched carrier tape 74 that surrounds the black feed hole 68 has the white color, as shown in FIG. 14B. Thus, the contrast between the respective colors of the two elements 68, 74 is sufficiently high, and accordingly accurate contour-defining data representing a contour of the first feed hole 68 can be obtained by taking an image of the first feed hole 68 and the carrier tape 74 and processing image data representing the thus taken image. In this case, since the contour-defining data representing the contour of the first feed hole 68 can be obtained based on the image taken at the black-feed-hole-image taking position, the wiring-board-image taking device 250 need not take an image at the white-feed-hole-image taking position. That is, based on just one image taking operation, a positional error of the center of the first feed hole 68 can be obtained and an amount of correction of the component-take position can be calculated.

Hereinafter, the component-take-position correcting operation will be described in more detail by reference to the flow chart shown in FIG. 15. During the component-take-position correcting operation, other operations such as the component taking operation or the component mounting operation are halted by the control device 24. The component-take-position correcting routine of FIG. 15 is started by the control device 24 in response to a command issued under the control of the basic operating program, or a user's operation of the input device 294. First, at Step S1, the control device 24 obtains a slot number as information representing a position of a feeder 40 for which the current component-take-position correcting operation is to be carried out. The slot number is a number assigned to an attachment slot as an attachment portion of the feeder-support table 38 where the feeder 40 is attached. The above-described component mounting program includes data related to each of the feeders 40 that supply the components 64 to be used in the current component mounting operation; respective slot numbers assigned to the respective attachment slots to which those feeders 40 are attached; respective sorts of the components 64 supplied from the respective attachment slots or positions; and accurate-suction data indicating whether each of those sorts of components 64 needs the accurate suction of the suction nozzle 240. Based on those data, the control device 24 obtains, in a numerical order, the respective slot numbers assigned to the respective attachment slots where the feeders 40 that supply the components 64 each requiring the accurate suction are attached. The thus obtained slot numbers are stored in an accurate-suction-requiring-slot-number memory portion of the RAM 274.

Subsequently, at Step S2, the control device 24 reads, from the accurate-suction-requiring-slot-number memory portion of the RAM 274, the smallest slot number of all the slot numbers stored therein. Step S2 is followed by Step S3 to move and stop the wiring-board-image taking device 250 to and at the black-feed-hole-image taking position pre-programmed for the feeder 40 corresponding to the slot number read at Step S2, i.e., the position that should be right above a first one of two adjacent feed holes 68 of the taping 50 or 52, held by the feeder 40, that is positioned above the black-colored portion 170. Then, at Step S4, the control device 24 commands the wiring-board-image taking device 250 to take an image of the first feed hole 68 positioned above the black-colored portion 170.

Subsequently, at Step S5, the control device 24 sends image data representing the thus taken image, to the image processing computer 288, and commands the computer 288 to process the image data. If the image processing computer 288 can obtain a contour of the first feed hole 68 by processing the image data, then the computer 288 obtains a positional error of the center of the feed hole 68. In the case where the current feeder 40 supplies the components 64 from the punched-carrier-type taping 52, the image processing computer 288 can obtain, based on the taken image of the first feed hole 68, contour-defining data representing the contour of the first feed hole 68 positioned above the black-colored portion 170, and can obtain, based on the thus obtained contour-defining data, the positional error of the center of the feed hole 68. At Step S5, the control device 24 receives the data that have been obtained by the image processing computer 288 from the taken image, and the control device 24 carries out, based on the thus received data, Step S6 to judge whether the contour-defining data representing the contour of the first feed hole 68 have been obtained. In the above-indicated case, a positive judgment is made at Step S6 and the control of the control device 24 goes to Step S7 to calculate, based on the positional error of the center of the first feed hole 68, an amount of correction of the component-take position and store, in a component-take-position-correction-amount memory portion of the RAM 274, the thus calculated correction amount associated with the slot number assigned to the current feeder 40.

Step S7 is followed by Step S8 to judge whether respective correction amounts of the respective component-take positions have been calculated for all the feeders 40 for each of which the component-take-position correcting operation is to be carried out. That is, the control device 24 judges whether the accurate-suction-requiring-slot-number memory portion of the RAM 274 has no slot numbers, i.e., there are no feeders 40 for which the component-take-position correction operation has not been carried out. If a negative judgment is made at Step S8, the control goes back to Step S2 to read out the next slot number corresponding to the feeder 40 for which the component-take-position correcting operation is to be carried out next, and then repeat Step S3 and the following steps.

On the other hand, in the case where the current feeder 40 supplies the components 64 from the embossed-carrier-type taping 50, the image processing computer 288 cannot obtain, based on the image of the first feed hole 68 taken at Step S4, contour-defining data representing the contour of the first feed hole 68 positioned above the black-colored portion 170, at Step S5. In this case, therefore, a negative judgment is made at Step S6 and the control of the control device 24 goes to Step S9 to move and stop the wiring-board-image taking device 250 to and at the white-feed-hole-image taking position pre-programmed for the feeder 40 corresponding to the slot number read at Step S2. Then, at Step S10, the control device 24 commands the wiring-board-image taking device 250 to take an image of the second feed hole 68 positioned above the white-colored portion 172. Steps S11 and S12 are identical with Steps S5 and S6, respectively. Since the image processing computer 288 can obtain contour-defining data representing the contour of the second feed hole 68, a positive judgment is made at Step S12, and the control goes to Step S13 to calculate an amount of correction of the component-take position and store, in the component-take-position-correction-amount memory portion of the RAM 274, the thus calculated correction amount associated with the slot number assigned to the current feeder 40. However, if the image processing computer 288 cannot obtain contour-defining data for some reason, then a negative judgment is made at Step S12 and the control goes to Step S14 to control a display device as an informing device, including the display screen 304, to display the slot number corresponding to the current feeder 40, and a message that contour-defining data have not been obtained.

Meanwhile, if a positive judgment is made at Step S8, the current control cycle on the present routine is ended. When the components 64 are mounted on the printed wiring board 30, the thus obtained correction amounts are used to correct the control data to control the operations of the X-Y robot 202 to move the mounting head 200 to the respective component-take positions for the feeders 40, and thereby correct those component-take positions. Therefore, even if the components 64 each requiring the accurate suction may be supplied from the feeder 40, each of those components 64 can be reliably sucked and taken from a corresponding one of the component accommodating pockets 62, 80.

As is apparent from the foregoing description of the first embodiment, the X-Y robot 202 constitutes a feeder-and-image-taking-device relatively moving device as a sort of feeder-and-optical-recognizing-device relatively moving device, and the X-Y robot 202 that constitutes the feeder-and-optical-recognizing-device relatively moving device also constitutes a holder-and-feeder relatively moving device. Thus, an electronic-circuit-component supplying and taking apparatus including the feeder-and-optical-recognizing-device relatively moving device and the holder-and-feeder relatively moving device can be simply constructed and can be produced at reduced cost. In addition, the wiring-board-image taking device 250 also functions as a feed-hole-image taking device as a sort of optical recognizing device. Owing to this feature, the present electronic-circuit-component supplying and taking apparatus can be produced at still reduced cost. Moreover, a portion of the control device 24 that carries out Steps S5 and S11 constitutes a feed-hole-position obtaining portion or a feed-hole-position-error obtaining portion, and an accommodating-pocket-position obtaining portion or an accommodating-pocket-position-error obtaining portion; a portion of the control device 24 that carries out Step S7 and a portion of the control device 24 that corrects, when the X-Y robot 202 is moved, the control data based on the correction amount cooperate with each other to constitute an X-Y-robot-control-data correcting portion as a sort of position correcting portion; and a portion of the control device 24 that carries out Steps S3, S6, and S9 constitutes a recognition-order-dependent movement control portion as a sort of movement control portion.

Figure 16:
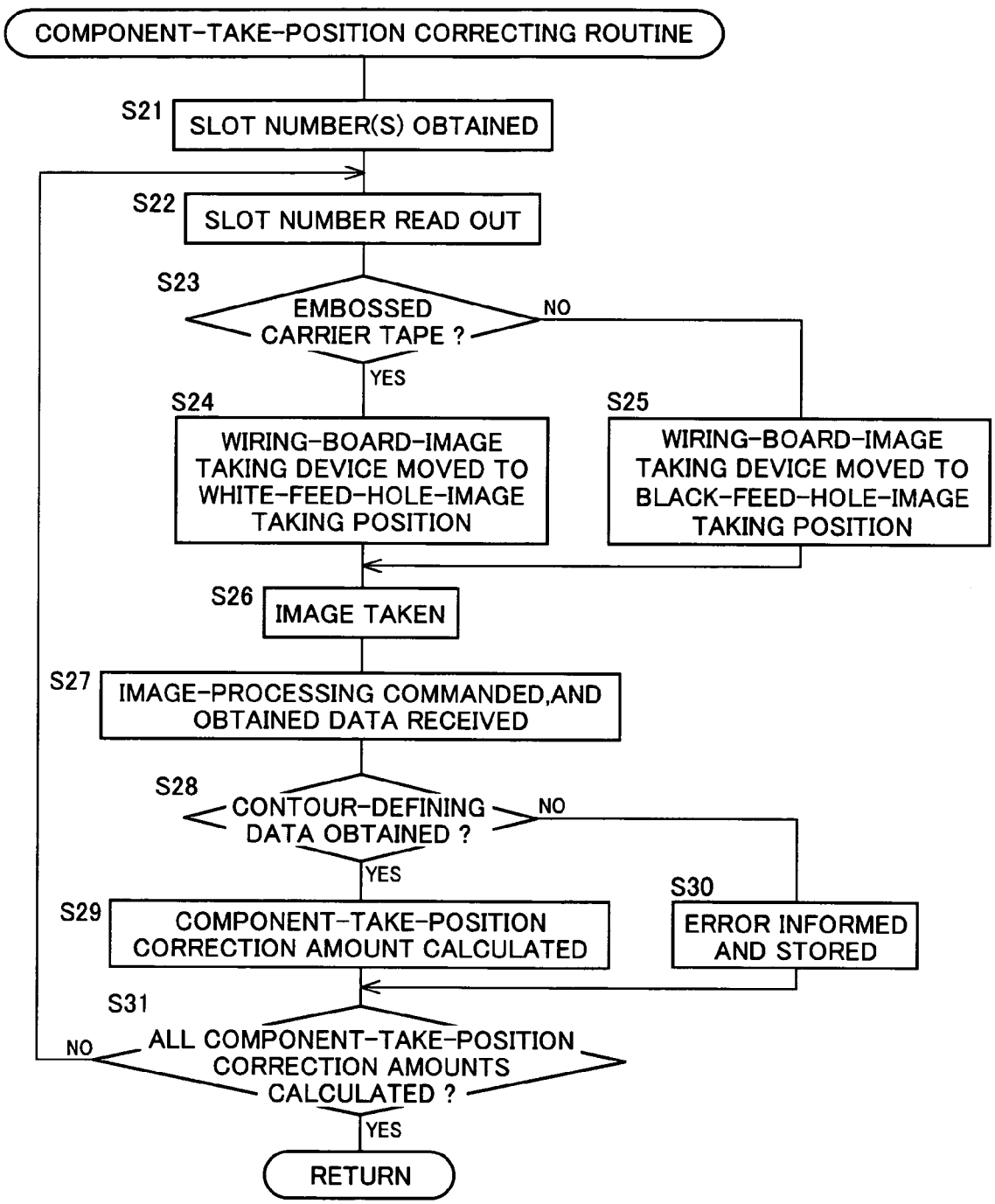
FIG. 16 is a flow chart representing another component-take-position correcting routine that is carried out by a control device of another electronic-circuit-component mounting system including another electronic-circuit-component supplying and taking apparatus as another embodiment of the present invention.

FIG. 16 shows another embodiment of the present invention that relates to another electronic-circuit-component supplying and taking apparatus. The same reference numerals as used in the above-described, first embodiment are used to designate the corresponding elements or parts of the present, second embodiment, and the description thereof is omitted. In the following description, only the differences between the first and second embodiments will be described. In the present apparatus, a single feed-hole-image taking position where a wiring-board-image taking device 250 is to take an image of a feed hole 68 is pre-determined, for each feeder 40, based on a sort of a taping 50, 52 that is to be fed by the each feeder 40 to supply components 64. More specifically described, a component mounting program includes information about by which carrier tape 54, 74 each sort of components 64 are carried, the embossed carrier tape 54 or the punched carrier tape 74 and, based on this information, the single feed-hole-image taking position is pre-determined.

In the second embodiment, a component-take position is corrected according to a component-take-position correcting routine represented by a flow chart shown in FIG. 16. Steps S21 and S22 of this routine are identical with Steps S1 and S2 of the component-take-position correcting routine shown in FIG. 15. At Step S23, a control device 24 judges whether the components 64 supplied by the current feeder 40 are carried on the embossed carrier tape 54. If a positive judgment is made at Step S23, the control of the control device 24 goes to Step S24 to move the wiring-board-image taking device 250 to the white-feed-hole-image taking position. Steps S26 through S31 are identical with the above-described Steps S10 through S14 and S8, respectively. Thus, a component-take-position correction amount is calculated. On the other hand, if the components 64 supplied by the current feeder 40 are carried on the punched carrier tape 74, then a negative judgment is made at Step S23, and the control goes to Step S25 to move the wiring-board-image taking device 250 to the black-feed-hole-image taking position so as to take an image of a feed hole 68 of the punched carrier tape 74. In this case, too, Steps S26 through S31 are carried out to calculate a component-take-position correction amount.

Figure 17:
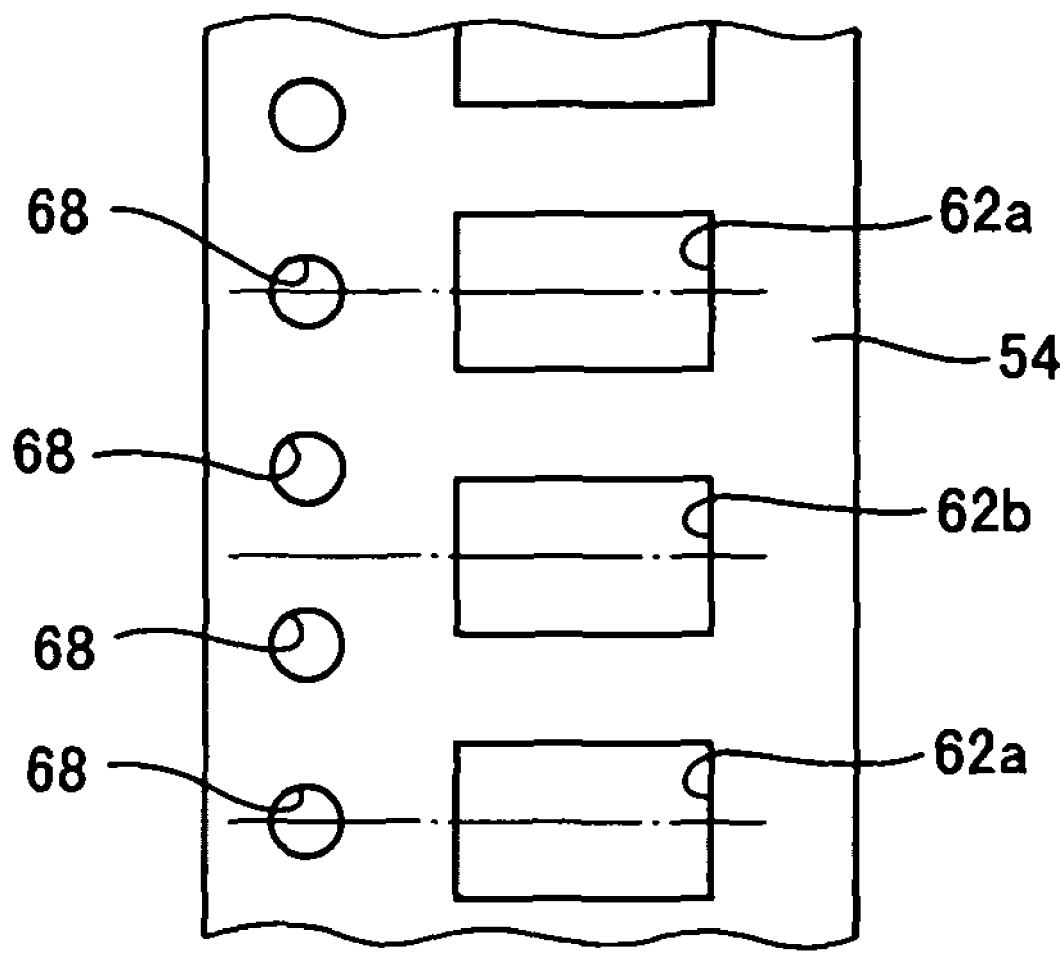
FIG. 17 is a plan view showing a relative-positional relationship between component accommodating pockets, and feed holes, of a carrier tape of a taping that is fed by a tape feeder of another electronic-circuit-component supplying and taking apparatus as another embodiment of the present invention.

In each of the above-described two embodiments, it is assumed that in the state in which one of the component accommodating pockets 62, 80 is positioned at the component-supply position, two adjacent feed holes 68 are positioned above the black-colored portion 170 and the white-colored portion 172, respectively. However, the principle of the present invention is applicable to feeders 40 that supply components 64 from tapings free of the above assumption. For example, FIG. 17 shows an embossed carrier tape 54 in which component accommodating pockets 62 (62*a*, 62*b*) are formed at a first pitch that is 1.5 times larger than a second pitch at which feed holes 68 are formed. In this case, providing that in a state in which one of the component accommodating pockets 62*a* is positioned at the component-supply position, one of two adjacent feed holes 68 is positioned above the black-colored portion 170 and the other feed hole 68 is positioned above the white-colored portion 172, then it can be said that in a state in which one of the component accommodating pockets 62*b* is positioned at the component-supply position, a middle one of three adjacent feed holes 68 is positioned on a boundary line between the black-colored portion 170 and the white-colored portion 172, and the other two feed holes 68 are not entirely positioned above the two colored portions 170, 172. More specifically described, no feed hole 68 is positioned at the center of the black-colored portion 170 or the white-colored portion 172, i.e., at either of the two recognizing positions. Hence, the control device 24 or the computer 280 commands the sprocket driving device 112 to rotate the sprocket 110 by an amount or angle corresponding to a distance equal to the first pitch at which the component accommodating pockets 62 (62*a*, 62*b*) are formed. Consequently one of the component accommodating pockets 62*a* is moved to the component-supply position, and one of two adjacent feed holes 68 is positioned above the black-colored portion 170 and the other, upstream feed hole 68 is positioned above the white-colored portion 172. Under this condition, an image of either one of the two feed holes 68 is taken, and a positional error of the one component accommodating pocket 62*a* is obtained based on the thus taken image.

The principle of the present invention is also applicable to such cases where the relative-positional relationship between the component accommodating pockets 62, 80 and the feed holes 68 in the lengthwise direction of the carrier tape 54, 74 changes in a more complex manner. For example, in the case where component accommodating pockets 62, 80 are formed at a first pitch that is N+1/M (N and M are integral numbers) times larger than a second pitch at which feed holes 68 are formed, the relative-positional relationship between the pockets 62, 80 and the holes 68 in the lengthwise direction of the carrier tape 54, 74 changes cyclically, i.e., at a cycle corresponding to feeding of the M pockets 62, 80. Therefore, in the same manner as described above, two adjacent feed holes 68 can be positioned above the two colored portions 170, 172, respectively, an image of either one of the two feed holes 68 can be taken, and a positional error of one component accommodating pocket 62, 80 can be obtained based on the thus taken image. The above-described case in which the first pitch is 1.5 times larger than the second pitch is the case where the integral number N is equal to 1 and the integral number M is equal to 2.

The white color having the value of Grade 10 reflects a large amount of light and accordingly can be said as glossy. However, if a gray color (e.g., a bright gray) is made of, e.g. a paint containing glossy particles (e.g., an aluminum pigment) so as to be able to reflect a large amount of light, even the gray color can be said as a "silver" color that is as glossy as the white color. Therefore, the white-colored portion 172 may be replaced with a silver-colored portion as another sort of optical-characteristic giving portion suitable for taking an image of a feed hole 68.

The wiring-board-image taking device 250 may be replaced with a full-color camera. In this case, at least one optical-characteristic giving portion may have a chromatic color. If the carrier tape 54, 74 has a chromatic color, at least one optical-characteristic giving portion may have either an achromatic color, or a chromatic color that enables the image taking device 250 to take accurately an image of a feed hole 68 in good contrast to the chromatic color of the carrier tape

54, 74. For example, the chromatic color of the optical-characteristic giving portion may a complementary color to the chromatic color of the carrier tape 54, 74. In the case where a plurality of optical-characteristic giving portions are employed, those optical-characteristic giving portions may be different-hue giving portions that have respective different hues differing from each other by not less than two basic hues, according to respective colors of different sorts of carrier tapes 54, 74 that can be selectively fed by a feeder 40. For example, in the case where two different-hue giving portions are employed, one of the two giving portions may be yellow and the other giving portion may be violet, or the one giving portion may be green and the other giving portion may be red.

The punched carrier tapes 74 formed of paper may be replaced with punched carrier tapes formed of a synthetic resin. In this case, too, at least one optical-characteristic giving portion can have an optical characteristic having a good contrast with respect to an optical characteristic of those punched carrier tapes, so that the image taking device 250 as the optical recognizing device can accurately take or recognize an image of a feed hole 68 of each of those punched carrier tapes.

In each of the above-described embodiments, the respective centers of the plurality of optical-characteristic giving portions 170, 172 coincide with the respective to-be-recognized positions of the plurality of feed holes 68. In this case, if the image taking device 250 as the optical recognizing device is adapted to take simultaneously the respective images of the plurality of feed holes 68 that are positioned right above the respective centers of the plurality of optical-characteristic giving portions 170, 172, then the respective positions of the plurality of feed holes 68, recognized based on the simultaneously taken images, can be said as the respective to-be-recognized positions of the plurality of feed holes 68.

However, it is not essentially required that a center of at least one optical-characteristic giving portion 170, 172 coincide with a to-be-recognized position of a feed hole 68. That is, it is just required that at least one optical-characteristic giving portion 170, 172 be provided along the path of movement of the feed holes 68. Thus, a center of at least one optical-characteristic giving portion 170, 172 may be offset from a to-be-recognized position of a feed hole 68 in a direction parallel to the direction of feeding of the carrier tape 54, 74, or in the widthwise direction of each feeder 40. In any case, at least one optical-characteristic giving portion 170, 172 is made larger than one of the feed holes 68, so that when the one feed hole 68 is recognized by the optical recognizing device 250, an entirety of the one feed hole 68 is positioned above the optical-characteristic giving portion 170, 172 and an optical characteristic of the giving portion 170, 172 is given to the one feed hole 68.

In each of the above-described embodiments, the positional error of the center of one feed hole 68 is calculated by the image processing computer 288. However, the positional error of the center of one feed hole 68 and the correction amount of the component-take position may be calculated by the computer 280 as a mounting control computer based on the data obtained by the image processing computer 288 from the image taken by the image taking device 250.

The present invention is applicable to not only the feeders 40, the electronic-circuit-component supplying apparatus, and the electronic-circuit-component supplying and taking apparatus that are employed by the X-Y-robot-type electronic-circuit-component mounting system, but also feeders, an electronic-circuit-component supplying apparatus, and an electronic-circuit-component supplying and taking apparatus that are employed by a rotary-head-type electronic-circuit-component mounting system such as an index-table-type mounting system (also called a rotary-type mounting system). The index-table-type electronic-circuit-component mounting system includes a rotary table or body supporting a plurality of nozzle holders each of which holds at least one suction nozzle, and a rotating device that rotates the rotary body so that respective suction nozzles held by the nozzle holders are sequentially moved to, and stopped at, each of a plurality of stop positions including a component-take position where each of the suction nozzles takes an electronic circuit component from a component supplying device, and a component-release position where the each suction nozzle releases the electronic circuit component and mounts it on a circuit substrate. As another sort of rotary-head-type electronic-circuit-component mounting system, there is known such an electronic-circuit-component mounting system which includes a plurality of rotary members (e.g., rotary plates) that support respective nozzle holders and that are rotatable independent of each other about a common axis line, and which additionally includes a rotary-motion applying device that applies a rotary motion to each of the rotary members such that while the each rotary member is fully rotated one time (i.e., 360 grades) about the common axis line, the each rotary member is stopped at least one time and such that the rotary motion of the each rotary member has a predetermined time difference from the rotary motion of another rotary member adjacent to the each rotary member.

Many rotary-head-type electronic-circuit-component mounting systems employ such a component supplying device that includes a plurality of tape feeders (e.g., the feeders 40) arranged in an X-axis direction and a feeder moving device as a sort of relatively moving device that moves the tape feeders in the X-axis direction. In those rotary-head-type electronic-circuit-component mounting systems, it is preferred that a feed-hole recognizing device (e.g., the image taking device 250) be provided in the vicinity of a component-take position of each of the tape feeders. In fact, the feeder moving device moves the tape feeders so that respective feed holes of respective carrier tapes held by the tape feeders are sequentially moved to a recognizing position that is opposed to the feed-hole recognizing device and where the recognizing device recognizes each of those feed holes. In the case where a plurality of optical-characteristic giving portions are employed by each tape feeder, a recognizing-device moving device that moves the optical recognizing device in a direction parallel to the direction of feeding of carrier tape, is employed so that the optical recognizing device may be moved to recognize sequentially a plurality of feed holes for the each tape feeder. If those mounting systems employ a circuit-substrate-image taking device (e.g., the image taking device 250) and a circuit-component-image taking device (e.g., the image taking device 262), and a moving device that moves at least one of the two image taking devices, it is possible to move the one or two image taking devices to each of a plurality of predetermined feed-hole-image taking positions so as to take an image of a corresponding one of a plurality of feed holes.

While the present invention has been described in detail in its preferred embodiments, it is to be understood that the present invention is by no means limited to the details of those embodiments but may be embodied with various changes and improvements, such as those described in DISCLOSURE OF THE INVENTION, that may occur to a person skilled in the art.

The invention claimed is:

1. A tape feeder, comprising:
a feeding member which feeds a carrier tape having a plurality of feed holes arranged in a lengthwise direction of the carrier tape, and a plurality of component accommodating pockets which are arranged in the lengthwise direction of the carrier tape, accommodate respective electronic circuit components and have a predetermined relative position relative to the plurality of feed holes, wherein the feeding member has at least one engaging projection to engage the feed holes of the carrier tape and thereby feed the carrier tape so that the respective electronic circuit components accommodated by the component accommodating pockets are sequentially positioned at a component-supply position; and
a tape-support surface which supports a surface of the carrier tape that is opposite to respective openings of the component accommodating pockets, and which has, in a path-related portion thereof located along a path of movement of the feed holes, at least one optical-characteristic giving portion which is larger than one of the feed holes and which has a first optical characteristic that is given to said one feed hole and is recognized differently by an optical recognizing device than a second optical characteristic had by an other portion of the path-related portion.

2. The tape feeder according to claim 1, wherein said at least one optical-characteristic giving portion is located in a vicinity of the component-supply position.

3. The tape feeder according to claim 1, wherein said at least one optical-characteristic giving portion comprises at least one color giving portion which has, as said first optical characteristic, a first color which is given to said one feed hole and thereby enables the optical recognizing device to recognize said one feed hole by distinguishing the first color from a second color of a portion of the carrier tape that surrounds said one feed hole.

4. The tape feeder according to claim 1, wherein the tape-support surface has, as a plurality of said optical-characteristic giving portions, a plurality of different-characteristic giving portions which have different first optical characteristics and which are arranged, in a direction of feeding of the carrier tape, at a pitch equal to a multiple of a pitch at which the feed holes are formed in the carrier tape.

5. The tape feeder according to claim 4, wherein the different-characteristic giving portions have, as the different first optical characteristics, at least one of (a) different hues and (b) different values.

6. The tape feeder according to claim 5, wherein the different-characteristic giving portions comprise a plurality of different-hue giving portions having (a) the different hues which differ from each other by not less than two basic hues in a hue circle consisting often basic hues.

7. The tape feeder according to claim 5, wherein the different-characteristic giving portions comprise a plurality of different-value giving portions having (b) the different values which differ from each other by not less than two grades often grades into which all values are classified.

8. The tape feeder according to claim 7, wherein the different-value giving portions comprise a bright-color giving portion which has a value of not lower than Grade 8, and a dark-color giving portion which has a value of not higher than Grade 3.

9. The tape feeder according to claim 8, wherein the bright-color giving portion comprises a white-color giving portion having a value of Grade 10, and the dark-color giving portion comprises a black-color giving portion which has a value of Grade 0.

10. The tape feeder according to claim 1, wherein the tape feeder selectively feeds, for supplying the respective electronic circuit components, an arbitrary one of (a) an embossed-carrier-type taping including an embossed carrier tape having the component accommodating pockets that accommodate the respective electronic circuit components, and (b) a punched-carrier-type taping including a punched carrier tape having the component accommodating pockets that accommodate the respective electronic circuit components.

11. The tape feeder according to claim 1, wherein said at least one optical-characteristic giving portion is located on an upstream side of the component-supply position with respect to a direction of feeding of the carrier tape.

12. An electronic-circuit-component supplying apparatus, comprising:
the tape feeder according to claim 1;
an optical recognizing device which recognizes said one of the feed holes of the carrier; tape by recognizing differently the first optical characteristic given to said one feed hole, from the second optical characteristic;
a feeder-and-recognizing-device relatively moving device which moves at least one of the tape feeder and the optical recognizing device relative to an other of the tape feeder and the optical recognizing device, so that the optical recognizing device is positioned, above said at least one optical-characteristic giving portion, at a recognizing position where the optical recognizing device recognizes said one feed hole;
a movement control portion which controls the feeder-and-recognizing-device relatively moving device; and
a pocket-position obtaining portion which obtains, based on the predetermined relative position and a position of said one feed hole recognized by the optical recognizing device, a position of one of the component accommodating pockets.

13. The electronic-circuit-component supplying apparatus according to claim 12, wherein the tape-support surface has, as a plurality of said optical-characteristic giving portions, a plurality of different-characteristic giving portions which have different first optical characteristics and which are arranged, in a direction of feeding of the carrier tape, at a pitch equal to a multiple of a pitch at which the feed holes are formed in the carrier tape, wherein the movement control portion comprises a recognition-order-dependent movement control portion which controls the feeder-and-recognizing-device relatively moving device such that the optical recognizing device recognizes, in a predetermined order, at least two feed holes of the plurality of feed holes that have, as respective backgrounds thereof at least two said different-characteristic giving portions, respectively.

14. The electronic-circuit-component supplying apparatus according to claim 12, wherein the tape-support surface has, as a plurality of said optical-characteristic giving portions, a plurality of different-characteristic giving portions which have different first optical characteristics and which are arranged, in a direction of feeding of the carrier tape, at a pitch equal to a multiple of a pitch at which the feed holes are formed in the carrier tape, wherein the movement control portion comprises a recognition-object-dependent movement control portion which controls the feeder-and-recognizing-device relatively moving device such that the optical recognizing device recognizes one of the plurality of feed holes that has, as a background thereof, a pre-selected one of the plurality of different-characteristic giving portions.

15. The electronic-circuit-component supplying apparatus according to claim 12, wherein the optical recognizing device comprises an image taking device which takes an image of said one feed hole.

16. An electronic-circuit-component supplying and taking apparatus, comprising:
the electronic-circuit-component supplying apparatus according to claim 12;
a nozzle holder which holds a suction nozzle that sucks, with a negative pressure, each of the respective electronic circuit components sequentially positioned at the component-supply position;
a holder-and-feeder relatively moving device which moves at least one of the nozzle holder and the tape feeder relative to an other of the nozzle holder and the tape feeder, so that the suction nozzle is positioned at a component-take position opposed to each of the component accommodating pockets sequentially positioned at the component-supply position; and
a position correcting portion which corrects the component-take position, based on the position of said one component accommodating pocket obtained by the pocket-position obtaining portion.

17. The electronic-circuit-component supplying and taking apparatus according to claim 16, comprising a plurality of said tape feeders which are arranged in an X-axis direction, wherein the holder-and-feeder relatively moving device comprises an X-Y robot which moves the nozzle holder in each of the X-axis direction and a Y-axis direction perpendicular to the X-axis direction, and wherein the position correcting portion comprises an X-Y-robot control data correcting portion which corrects the component-take position by correcting control data to control an operation of the X-Y robot.

18. The tape feeder according to claim 1, wherein the first optical characteristic and the second optical characteristic are different from each other with respect to at least one of hue, value, saturation, and reflection coefficient.

* * * * *